(12) United States Patent
Shi et al.

(10) Patent No.: US 9,887,309 B2
(45) Date of Patent: *Feb. 6, 2018

(54) PHOTOVOLTAIC LEAD-SALT SEMICONDUCTOR DETECTORS

(71) Applicant: The Board of Regents of the University of Oklahoma, Norman, OK (US)

(72) Inventors: Zhisheng Shi, Norman, OK (US); Jijun Qiu, Norman, OK (US); Binbin Weng, Norman, OK (US)

(73) Assignee: The Board of Regents of the University of Okalahoma, Norman, OK (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/975,404

(22) Filed: Dec. 18, 2015

(65) Prior Publication Data
US 2016/0111579 A1 Apr. 21, 2016

Related U.S. Application Data

(63) Continuation-in-part of application No. PCT/US2014/043487, filed on Jun. 20, 2014, which
(Continued)

(51) Int. Cl.
*H01L 31/102* (2006.01)
*H01L 31/109* (2006.01)
(Continued)

(52) U.S. Cl.
CPC .... *H01L 31/109* (2013.01); *H01L 31/022408* (2013.01); *H01L 31/0324* (2013.01);
(Continued)

(58) Field of Classification Search
None
See application file for complete search history.

(56) References Cited

U.S. PATENT DOCUMENTS

| | | |
|---|---|---|
| 3,178,312 A | 4/1965 | Johnson |
| 3,716,424 A | 2/1973 | Schoolar |
| (Continued) | | |

FOREIGN PATENT DOCUMENTS

| | | |
|---|---|---|
| CN | 101170149 A | 4/2008 |
| CN | 102017147 A | 4/2011 |
| (Continued) | | |

OTHER PUBLICATIONS

Rodrigo, M.T., et al., "Polycrystalline lead selenide x-y addressed uncooled focal plane arrays," Infrared Physics & Technology, vol. 44, No. 4, Aug. 2003, pp. 281-287.
(Continued)

*Primary Examiner* — Minh-Loan Tran
(74) *Attorney, Agent, or Firm* — Conley Rose, P.C.; Grant Rodolph; Jonathan K. Polk

(57) ABSTRACT

Disclosed is at least one embodiment of an infrared (IR) photovoltaic (PV) detector, comprising a IV-VI Lead (Pb)-salt layer disposed on a substrate and a charge-separation-junction (CSJ) structure associated with the IV-VI Pb-salt layer, wherein the CSJ structure comprises a plurality of element areas disposed upon or within the IV-VI Pb-salt layer, wherein the plurality of element areas are spaced apart from each other. Each element area may be connected to a first Ohmic contact thereby forming a plurality of interconnected first Ohmic contacts, and a second Ohmic contact may be disposed upon a portion of the IV-VI Pb-salt layer. In another non-limiting embodiment, a PV detector, comprising a heterojunction region that comprises at least one IV-VI Pb-salt material layer coupled to at least one non-Pb-salt layer, wherein the at least one IV-VI Pb-salt layer and
(Continued)

the at least one non-Pb-salt layer form a p-n junction or Schottky junction with a type II band gap alignment.

21 Claims, 9 Drawing Sheets

Related U.S. Application Data is a continuation of application No. PCT/US2013/075110, filed on Dec. 13, 2013, application No. 14/975,404, which is a continuation-in-part of application No. 14/652,008, filed as application No. PCT/US2013/075110 on Dec. 13, 2013.

(60) Provisional application No. 61/837,490, filed on Jun. 20, 2013, provisional application No. 61/736,987, filed on Dec. 13, 2012, provisional application No. 61/969,975, filed on Mar. 25, 2014.

(51) Int. Cl.
| | |
|---|---|
| H01L 31/108 | (2006.01) |
| H01L 31/068 | (2012.01) |
| H01L 31/042 | (2014.01) |
| H01L 31/0352 | (2006.01) |
| H01L 31/0749 | (2012.01) |
| H01L 31/0336 | (2006.01) |
| H01L 31/072 | (2012.01) |
| H01L 31/0224 | (2006.01) |
| H01L 31/032 | (2006.01) |

(52) U.S. Cl.
CPC ...... *H01L 31/0336* (2013.01); *H01L 31/0352* (2013.01); *H01L 31/042* (2013.01); *H01L 31/068* (2013.01); *H01L 31/072* (2013.01); *H01L 31/0749* (2013.01); *H01L 31/108* (2013.01); *Y02E 10/50* (2013.01)

(56) References Cited

U.S. PATENT DOCUMENTS

| | | | |
|---|---|---|---|
| 3,904,879 | A | 9/1975 | Amingual et al. |
| 3,911,469 | A | 10/1975 | Wrobel |
| 4,154,631 | A | 5/1979 | Schoolar |
| 4,183,035 | A | 1/1980 | Wang et al. |
| 4,870,027 | A | 9/1989 | Chu et al. |
| 4,962,303 | A | 10/1990 | Chu |
| 4,996,579 | A | 2/1991 | Chu |
| 5,581,084 | A | 12/1996 | Chapman et al. |
| 5,664,990 | A | 9/1997 | Adams |
| 7,400,663 | B2 | 7/2008 | Shi |
| 8,035,184 | B1 | 10/2011 | Dutta et al. |
| 8,357,960 | B1 | 1/2013 | Dutta |
| 2002/0058352 | A1 | 5/2002 | Jacksen et al. |
| 2004/0097021 | A1 | 5/2004 | Augusto et al. |
| 2006/0091284 | A1 | 5/2006 | Viens et al. |
| 2006/0202120 | A1 | 9/2006 | Kauffman et al. |
| 2007/0176104 | A1 | 8/2007 | Geneczko et al. |
| 2008/0006774 | A1 | 1/2008 | Ogando et al. |
| 2008/0224046 | A1 | 9/2008 | Ogando et al. |
| 2009/0073569 | A1 | 3/2009 | Jiang et al. |
| 2009/0120501 | A1 | 5/2009 | Engle |
| 2009/0152664 | A1 | 6/2009 | Klem et al. |
| 2010/0025796 | A1 | 2/2010 | Dabiran |
| 2010/0102204 | A1 | 4/2010 | Hoffman |
| 2010/0257696 | A1 | 10/2010 | Maguire et al. |
| 2010/0295141 | A1 | 11/2010 | Abbott |
| 2011/0146766 | A1 | 6/2011 | Nozik et al. |
| 2011/0315988 | A1 | 12/2011 | Yu et al. |
| 2012/0045691 | A1 | 2/2012 | Douglas |
| 2012/0205624 | A1 | 8/2012 | Sargent et al. |
| 2012/0326210 | A1 | 12/2012 | Shi |
| 2013/0001731 | A1 | 1/2013 | Forrest et al. |
| 2014/0154874 | A1 | 6/2014 | Shi |
| 2014/0252529 | A1 | 9/2014 | Shi et al. |
| 2015/0325723 | A1 | 11/2015 | Shi |
| 2016/0111567 | A1* | 4/2016 | Shi ...................... H01L 31/0324 257/441 |

FOREIGN PATENT DOCUMENTS

| | | |
|---|---|---|
| CN | 104995750 A | 10/2015 |
| WO | 2014093877 A1 | 6/2014 |
| WO | 2014137748 A1 | 9/2014 |

OTHER PUBLICATIONS

Johnson, T.H., "Lead Salt Detectors and Arrays PbS and PbSe," Proceedings of SPIE, 1984, pp. 60-94.
Munoz, A., et al., "PbSe photodectctor arrays for IR sensors," Thin Solid Fims 317, 1998, pp. 425-428.
Yasuoka, Y., Thermally Stimulated Current of Vacuum Deposited PbSe Films, Japanese Journal of Applied Physics, vol. 13, No. 11, 1974, pp. 1797-1803.
Briones, F., et al., "The Role of Oxygen in the Sensitization of Photoconductive PbSe Films," Thin Solid Films, 78, 1981, pp. 385-395.
Candea, R. M., et al., "Effects of Thermal Annealing in Air on VE, COD and CAD PbSe Films," Institute of Isotopic and Molecular Technology, 1987, pp. 149-155.
Petritz, R., "Theory of Photoconductivity in Semiconductor Films," Physical Review, vol. 104, No. 6, Dec. 15, 1956, pp. 1508-1516.
Nimtz, G., et al., "Narrow-Gap Lead Salts," vol. 98, 1982, pp. 100-108.
Zogg, H., et al., "Carrier Recombination in Single Crystal PbSe," Solid-State Electronics, vol. 25, No. 12, 1982, pp. 1147-1155.
Emtage, P. R., et al., "Auger recombination and junction resistance in lead-tin telluride," AIP Journal of Applied Physics, vol. 47, No. 6, Jun. 1976, pp. 2565-2568.
Ziep., O., "A New Approach to Auger Recombination," Phy. Stat. Sol., vol. 98, 1980, pp. 133-142.
Zhao, F., et al., "Influence of oxygen passivation on optical properties of PbSe thin films," Applied Physics Letters, Letter 92, 2008, 3 pages.
Torquemada, M. C., et al., "Role of halogens in the mechanism of sensitization of uncooled PbSe infrared photodetectors," AIP Journal of Applied Physics 93, Feb. 1, 2003, pp. 1778-1784.
Barote, M., et al., "Growth and Characterization of Chemical Bath Deposited Polycrystalline n-PbSe thin films," Research Journal of Chemical Sciences, vol. 1, No. 5, ISSN 2231-606X, Aug. 2011, pp. 48-51.
Espevik, S., et al., "Mechanisms of Photoconductivity in Chemically Deposited Lead Sulfide Layers," AIP Journal of Applied Physics 42, 1971, pp. 3513-3529.
Weng, B., et al., "Room temperature mid-infrared surface-emitting photonic crystal laser on silicon," AIP Applied Physics Letters 99, 2011, 3 pages.
Foreign Communication From a Counterpart Application, PCT Application No. PCT/US2014/43487, International Search Report dated May 15, 2015, 7 pages.
Foreign Communication From a Counterpart Application, PCT Application No. PCT/US2014/43487, Written Opinion dated May 15, 2015, 8 pages.
Foreign Communications From a Counterpart Application, PCT Application No. PCT/US2013/075110, International Search Report dated Mar. 27, 2014, 5 pages.
Foreign Communications From a Counterpart Application, PCT Application No. PCT/US2013/075110, Written Opinion dated Mar. 27, 2014, 12 pages.
Foreign Communication From A Counterpart Application, Chinese Application No. 201380072673.1, Chinese Office Action dated May 11, 2016, 19 pages.
Foreign Communication From a Counterpart Application, Chinese Application No. 201480034918.6, Chinese Office Action dated Sep. 1, 2016, 8 pages.

(56) References Cited

OTHER PUBLICATIONS

Foreign Communication From A Counterpart Application, Chinese Application No. 201480034918.6, English Translation of Chinese Office Action dated Sep. 1, 2016, 6 pages.
Foreign Communication From A Counterpart Application, Chinese Application No. 201480034918.6, Chinese Office Action dated May 3, 2017, 5 pages.
Office Action dated Aug. 26, 2016, 13 pages, U.S. Appl. No. 14/652,008, filed Jun. 12, 2015.
Office Action dated Mar. 13, 2017, 6 pages, U.S. Appl. No. 14/975,285, filed Dec. 18, 2015.
Zhao, F., et al.; "MBE Growth of PbSe Thin Film with a 9 x 105 cm-2 Etch-Pits Density on Patterned (111)-Oriented Si Substrate"; Journal of Crystal Growth; Jun. 2, 2010; 4 pages.
Konstantatos, Gerasimos, et al.; "Solution-Processed Quantum Dot Photodetectors"; Proceedings of the IEEE; vol. 97; No. 10; Oct. 2009; 18 pages.
Kovalenko, Maksym V., et al.; "SnTe Nanocrystals: A New Example of Narrow-Gap Semiconductor Quantum Dots"; J. Am. Chem. Soc.; American Chemical Society; Aug. 28, 2007; 2 pages.
Vioreels, Iwan, et al.; "Size-Dependent Optical Properties of Colloidal PbS Quantum Dots"; ACS NANO; vol. 3; No. 10; 2009; 8 pages.
Quintero-Torres, Rafael, et al.; "Photoluminescence Dynamics in Solid Formulations of Colloidal PbSe Quantum Dots: Three-Dimensional Versus Two-Mimensional Films"; Applied Physics Letters; vol. 101; 2012; 5 pages.
Chen, Hsiang-Sheng, et al.; "Direct Synthesis of Size-Tunable PbS Nanocubes and Octahedra and the pH Effect on Crystal Shape Control"; The Royal Society of Chemistry; 2014; 7 pages.
Weng, Binbin, et al.; "CdS/PbSe Heterojunction for High Temperature Mid-Infrared Photovoltaic Detector Applications"; Applied Physics Letters; vol. 104; AIP Publishing LLC; Mar. 27, 2014; 6 pages.
Weng, Binbin, et al.; "Numerical Analysis of CdS/PbSe Room Temperature Mid-Infrared Heterojunction Photovoltaic Detectors"; Proc. Of SPIE; vol. 9451; 2015; 10 pages.
Zhao, Lihua, et al.; "Understanding Sensitization Behavior of Lead Selenide Photoconductive Detectors by Charge Separation Model"; Journal of Applied Physics; vol. 115; AIP Publishing LLC; Feb. 25, 2014; 5 pages.
Zhao, F., et al.; "Influence of Oxygen Passivation on Optical Properties of PbSe Thin Films"; Applied Physics Letters; vol. 92; May 30, 2008; 3 pages.
Qiu, Jijun, et al.; "Coaxial Multi-Shelled TiO2 Nanotube Arrays for Dye Sensitized Solar Cells" Journal of Materials Chemistry; vol. 22; January 19, 2012; 6 pages.
Qiu, Jijun, et al.; "Branched Double-Shelled TiO2 Nanotube Networks on Transparent Conducting Oxide Substrates for Dye Sensitized Solar Cells"; Journal of Materials Chemistry; vol. 22; Sep. 20, 2012; 7 pages.
Cademartiri, Ludovico, et al.; "Size-Dependent Extinction Coefficients of PbS Quantum Dots"; J. Am. Chem. Soc. vol. 128; 2006; 10 pages.
Petkov, V., et al.; "PbSe Quantum Dots: Finite, Off-Stoichiometric, and Structurally Distorted"; Physical Review B; vol. 81; The American Physical Society; Jun. 8, 2010; 4 pages.
Vasiliev, Roman B., et al.; "Synthesis and Optical Properties of PbSe and CdSe Colloidal Quantum Dots Capped with Oleic Acid"; Mendeleev Commun.; 2004; 3 pages.
Lipovskii, A., et al.; "Synthesis and Characterization of PbSe Quantum Dots in Phosphate Glass"; Appl. Phys. Lett.; vol. 71; Dec. 8, 1997; 3 pages.
Qiu, Jijun, et al.; "Large-Scale Self-Assembled Epitaxial Growth of Highly-Ordered Three-Dimensional Micro/Nano Single-Crystalline PbSe Pyramid Arrays by Selective Chemical Bath Deposition"; Materials Research Express; vol. 2; IOP Publishing; May 19, 2015; 11 pages.
PCT International Search Report; Application No. PCT/US2014/019063; dated Jun. 20, 2014; 3 pages.
PCT Written Opinion of the International Searching Authority; Application No. PCT/US2014/019063; dated Jun. 20, 2014; 7 pages.
PCT International Preliminary Report on Patentability; Application No. PCT/US2014/019063; dated Mar. 16, 2015; 17 pages.
Office Action dated Aug. 8, 2013; U.S. Appl. No. 13/168,290, filed Jun. 24, 2011; 11 pages.
Office Action dated Aug. 6, 2014; U.S. Appl. No. 14/174,618, filed Feb. 6, 2014; 9 pages.
Office Action dated Jun. 17, 2015; U.S. Appl. No. 141193,681, filed Feb. 28, 2014; 6 pages.
Office Action dated Nov. 13, 2015; U.S. Appl. No. 14/193,681, filed Feb. 28, 2014; 18 pages.
Office Action dated April 7, 2016; U.S. Appl. No. 14/652,008, filed Jun. 12, 2015; 8 pages.
Norton, Paul R.; "Infrared Image Sensors"; Optical Engineering; vol. 30; No. 11; Nov. 1991; 15 pages.
Tennant, W.E.; "Limits of Infrared Imaging"; International Journal of High Speed Electronics and Systems; vol. 20; No. 3; 2011; 11 pages.
Vuillermet, M., et al.; "Status of MCT Focal Plane Arrays in France"; Proc. Of SPIE; vol. 8353; 2012; 12 pages.
DeWAMES, Roger E, et al.; "Electrical Characteristics of MOVPE Grown MWIR N+p(As) HgCdTe Hetero-Structure Photodiodes Build on GaAs Substrates"; Proc. Of SPIE; vol. 8353; 2012; 10 pages.
Rogalski, A.; "Analysis of the R0A Product in n+—p Hg1—x CdxTe Photodiodes"; Infrared Phys. vol. 28; No. 3; 1988; 16 pages.
Klann, Robert, et al.; "Fast Recombination Processes in Lead Chalcogenide Semiconductors Studied via Transient Optical Nonlinearities"; J. Appl. Phys. vol. 77; Issue 1; American Institute of Physics; Jan. 1, 1995; 11 pages.
Findlay, P.C., et al.; "Auger Recombination Dynamics of Lead Salts Under Picosecond Free-Electron-Laser Excitation"; Physical Review B.; vol. 58; No. 9; The American Physical Society; Nov. 15, 1998; 8 pages.
Meyer, J.R., et al.; "Auger Coefficients in Type-II InAs/Ga1-xInxSb Quantum Wells"; Applied Physics Letters; vol. 73; No. 20; American Institute of Physics; Nov. 16, 1998; 4 pages.
Hillhouse, Hugh W., et al.; "Solar Cells from Colloidal Nanocrystals: Fundamentals, Materials, Devices, and Economics"; Current Opinion in Colloid & Interface Science; vol. 14; Issue 4; May 12, 2009; 15 pages.
Schaller, R.D., et al.; "High Efficiency Carrier Multiplication in PbSe Nanocrystals: Implications for Solar Energy conversion"; Physical Review Letters; vol. 92; No. 18; The American Physical Society; May 5, 2004; 4 pages.
Semonin, Octavi E., et al.; "Peak External Photocurrent Quantum Efficiency Exceeding 100% via MEG in a Quantum Dot Solar Cell"; Science; vol. 334; Dec. 16, 2011; 5 pages.
Cunningham, Paul D., et al.; "Enhanced Multiple Exciton Generation in Quasi-One-Dimensional Semiconductors"; Nano Letters; ACS Publications; Jul. 18, 2011; 6 pages.
Qiu; Jijun, et al.; "Branched Double-Shelled TiO2 Nanotube Networks on Transparent Conducting Oxide Substrates for Dye Sensitized Solar Cells"; Journal of Materials Chemistry; Issue 44; Sep. 20, 2012; 5 pages.
Qiu, Jijun, et al.; "Coaxial Multi-Shelled TiO2 Nanotube Arrays for Dye Sensitized Solar Cells"; Journal of Materials chemistry; vol. 22; Issue 8; Jan. 19, 2012; 5 pages.
Li, Lin, et al.- "Measurement of the Valence Band-Offset in a PbSe/ZnO Heterojunction by X-Ray Photoelectron Spectroscopy"; Applied Physics Letters; vol. 101; American Institute of Physics; Dec. 26, 2012; 6 pages.
Masumoto, Yasuaki, et al.; "Fast Electron Transfer from PbSe Quantum Dots to TiO2"; Applied Physics Letters; vol. 100; American Institute of Physics; Jun. 19, 2012; 5 pages.
Choi, Joshua J., et al.; "PbSe Nanocrystal Excitonic Solar Cells"; Nano Letters; vol. 9; No. 11; American Chemical Society; Aug. 31, 2009; 7 pages.
Timp, Brook A., et al.; "Electronic Energy Alignment at the PbSe Quantum Dots/ZnO (1010) Interface"; Surface Science; vol. 604; May 21, 2010; 7 pages.

(56) References Cited

OTHER PUBLICATIONS

Leschkies, Kurtis S., et al.; "Nanowire-Quantum-Dot Solar Cells and the Influence of Nanowire Length on the charge Collection Efficiency"; Applied Physics Letters; vol. 95; American Institute of Physics; Nov. 10, 2009; 4 pages.
Wang, Zhong Lin, et al.; "Piezoelectric Nanogenerators Based on Zinc Oxide Nanowire Arrays"; Science; vol. 312; Apr. 14, 2006; 6 pages.
Carlson, Brooke, et al.; "Valence Band Alignment at Cadmium Selenide Quantum Dot and Zinc Oxide (1010) Interfaces"; The Journal of Physical Chemistry; American Chemical Society; May 2, 2008; 5 pages.
Lin, Yi-Feng, et al.; "Alternating the Output of a CdS Nanowire Nanogenerator by a White-Light-Stimulated Optoelectronic Effect"; Advanced Materials; vol. 20; Issue 16; Jul. 4, 2008; 4 pages.
Sridaran, Sujatha, et al.; "Carrier Transport Properties of Al/CdS/GaSb Structures"; Applied Physics Letters; vol. 89; American Institute of Physics; Oct. 5, 2006; 3 pages.
Qiu, Jijun, et al.; "Study of Sensitization Process on Mid-Infrared Uncooled PbSe Photoconductive Detectors Leads to High Detectivity"; Journal of Applied Physics; vol. 113; American Institute of Physics; Mar. 11, 2013; 6 pages.
Weng, Binbin, et al.; "Responsivity Enhancement of Mid-Infrared PbSe Detectors Using CaF2 Nano-Structured Antireflective Coatings"; Applied Physics Letters; vol. 104; AIP Publishing LLC; Jan. 14, 2014; 5 pages.
Hohnke, D.K., et al.; "Epitaxial PbSe Schottky-Barrier Diodes for Infrared Detection"; Applied Physics Letters; vol. 24; No. 12; American Institute of Physics; Jun. 15, 1974; 4 pages.
Zogg, Hans, et al.; "Photovoltaic IV-VI on Si Infrared Sensor Arrays for Thermal Imaging"; Optical Engineering; vol. 34; No. 7; Jul. 1995; 6 pages.
Müller, P., et al.; "Reduction of Threading Dislocation Densities in Heavily Lattice Mismatched PbSe on Si (111) by Glide"; Physical Review Letters; vol. 78; No. 15; The American Physical Society; Apr. 14, 1997; 4 pages.
Weng, Binbin, et al.; "Elimination of Threading Dislocations in As-Grown PbSe Film on Patterned Si(111) Substrate Using Molecular Beam Epitaxy"; Applied Physics Letters; vol. 96; American Institute of Physics; Jun. 25, 2010; 4 pages.
Gupta, S.C., et al.; "Comparison of Schottky Barrier and Diffused Junction Infrared Detectors"; Infrared Physics; vol. 19; 1979; 4 pages.
Preier, H.; "Comparison of the Junction Resistance of (PbSn)Te and (PbSn)Se Infrared Detector Diodes"; Infrared Physics; vol. 18; 1978; 4 pages.
Zogg, Hans, et al.; "Photovoltaic Lead-Chalcogenide on Silicon Infrared Sensor Arrays"; Optical Engineering; vol. 33; No. 5; May 1994; 10 pages.
Ferekides, C.S., et al.; "High Efficiency CSS CdTe Solar Cells"; Thin Solid Films; Feb. 2000; 7 pages.
Orgassa, Kay, et al.; "Role of the CdS Buffer Layer as an Active Optical Element in Cu(In,Ga)Se2 Thin-Film Solar Cells"; Progress in Photovoltaics: Research and Applications; Jun. 6; 2002; 7 pages.

Sfina, N., et al.; "A Multi-Color CdS/ZnSe Quantum Well Photodetector for Mid- and Long-Wavelength Infrared Detection"; Materials Science in Semiconductor Processing; Dec. 25, 2013; 6 pages.
Brus, L.E.; "A Simple Model for Ionization Potential, Electron Affinity, and Aqueous Redox potentials of Small Semiconductor Crystallites"; J. Chem. Phys.; vol. 79; Issue 11; American Institute of Physics; Dec. 1, 1983; 7 pages.
Okumura, H., et al.; "Comparison of Conventional Surface Cleaning Methods for Si Molecular Beam Epitaxy"; J. Electrochem. Soc.; vol. 144; No. 11; Nov. 1997; 4 pages.
Dereniak, E.L., et al.; "Infrared Detectors and Systems —Figures of Merit for Optical Detectors"; John Wiley & Sons; New York; 1996; 1 page.
Rogalski, A., et al.; "Effect of Structure on the Quantum Efficiency and RoA Product of Lead-Tin Chalcogenide Photodiodes"; Infrared Phys. vol. 22; 1982; 10 pages.
Ravich, Yu I., et al.; "Scattering of Current Carriers and Transport Phenomena in Lead Chalcogenides"; Phys. Stat. Sol.; vol. 43; 1971; 17 pages.
Ziep, O., et al.; "Calculation of the Interband Absorption in Lead Chalcogenides Using a Multiband Model"; Phys. Stat. Sol; vol. 96; 1979; 10 pages.
Katzir, A., et al.; "Handbook of Solid-State Lasers: Chapter 3—Tunable Lead Salt Lasers"; Marcel Dekker; New York; 1989; 63 pages.
Varshni, Y.P., et al.; "Temperature Dependence of the Energy Gap in Semiconductors"; Physica; vol. 34; 1967; 6 pages.
Jiang, Xiaomei, et al.; "PbSe Nanocrystal/Conducting Polymer Solar Cells with an Infrared Response to 2 Micron"; J. Mater. Res.; vol. 22; No. 8; Aug. 2007; 7 pages.
Werner, Jürgen H., et al.; "Barrier Inhomogeneities at Schottky Contacts"; J. Appl. Phys.; vol. 69; American Institute of Physics; Feb. 1, 1991; 13 pages.
Weng Binbin, et al.; "Mid-Infrared Surface-Emitting Photonic Crystal Microcavity Light Emitter on Silicon"; Applied Physics Letters; vol. 97; American Institute of Physics; Dec. 6, 2010; 4 pages.
Ma, J. G., et al.; "Growth Mechanism of Cuboid Growth Pits in Lead Selenide Epilayers Grown by Molecular Beam Epitaxy"; Journal of Physics D: Applied Physics; vol. 43; IOP Publishing; Oct. 27, 2010; 7 pages.
Foreign Communications From a Counterpart Application, PCT Application No. PCT/US2013/075110, PCT International Preliminary Report on Patentability dated Dec. 16, 2014, 43 pages.
Foreign Communication From A Counterpart Application, Chinese Application No. 201380072673.1, Chinese Office Action dated Feb. 20, 2017, 20 pages.
Final Office Action dated Jun. 29, 2017; U.S. Appl. No. 14/652,008, filed Jun. 12, 2015; 19 pages.
Foreign Communication From A Counterpart Application, Chinese Application No. 201480034918.6, Chinese Notice of Allowance dated Sep. 5, 2017, 6 pages.
Office Action dated Aug. 29, 2017, 17 pages, U.S. Appl. No. 14/975,285, filed Dec. 18, 2015.

\* cited by examiner

PHOTOVOLTAIC LEAD-SALT SEMICONDUCTOR DETECTORS

CROSS-REFERENCE TO RELATED APPLICATIONS

The present application is a Continuation-in-Part of International Application No. PCT/US2014/043487, filed on Jun. 20, 2014, which claims priority to U.S. Provisional Patent Application No. 61/837,490 filed Jun. 20, 2013, International Application No. PCT/US2013/075110 filed Dec. 13, 2013, and U.S. Provisional Patent Application No. 61/969,975 filed Mar. 25, 2014. The present application is also a Continuation-in-Part of U.S. patent application Ser. No. 14/652,008, filed Jun. 12, 2015, which claims priority to International Application No. PCT/US2013/075110, filed on Dec. 13, 2013, which claims priority to U.S. Provisional Patent Application No. 61/736,987, filed Dec. 13, 2012, all of which are incorporated herein by reference as if reproduced in their entirety.

STATEMENT REGARDING FEDERALLY SPONSORED RESEARCH OR DEVELOPMENT

This invention was made with government support from the Department of Defense (DOD) Air Force Office of Scientific Research (AFOSR) grant FA9550-12-1-0451 and the DOD Army Research Office (ARO) grant W911NF-07-1-0587. The government has certain rights in the invention.

REFERENCE TO A MICROFICHE APPENDIX

Not applicable.

BACKGROUND

Detection of light emitted in the infrared (IR) wavelength region of the spectrum (e.g. mid-infrared wavelengths from about 2 micrometers ($\mu$m) to about 8 $\mu$m (mid-IR) and long/low-wavelength infrared wavelengths (LWIR) from about 8 $\mu$m to about 15 $\mu$m) may have wide spread applications that include missile defense, night vision imaging for security and soldiers, and trace gas sensing imaging, such as chemical detection and explosive detection. Current detection technologies with high sensitivity are typically based on semiconductor photodetectors. In the past, many semiconductor material systems have been studied and progress has been made in developing semiconductor photodetectors. For instance, several industry approaches for semiconductor material photodetectors include Mercury-Cadmium-Telluride (HgCdTe) based photodetectors (MCT photodetectors), Indium-Antimonide (InSb) based photodetectors, and quantum well infrared photodetectors (QWIPs). Although progress has been made, the semiconductor photodetectors generally operate at relatively low temperatures in conjunction with cooling systems.

Among the different semiconductor photodetectors, typically MCT is used for mid-IR Focal Plane Array (FPA) applications. For example, MCT may be produced by using molecular beam epitaxy (MBE) on Cadmium-Zinc-Telluride (CdZnTe) substrates. However, the CdZnTe substrates are often relatively costly, brittle and of relatively small size. As a result, the semiconductor industry is attempting to transfer the growth and processes of MCT to alternative substrates, such as Silicon (Si). Transferring the growth and processes of MCT to a Si substrate may encounter problems because of the about 19% lattice mismatch and about 100% thermal mismatch that may cause deleterious effects on the final FPA. To date, at the FPA level, median sensitivity and noise characteristics are often equivalent to CdZnTe-based arrays, but unfortunately, array operability can be relatively low. In addition, because of defect related tunneling in MCT, FPAs using MCT produce undesired levels of electronic noise and non-uniformities. The non-uniformities may be corrected with algorithms that employ powerful signal processors. Moreover, cooling is required for MCT detectors to achieve a relatively high sensitivity. Thus, MCT may have a relatively high cost of MCT FPAs, suffer from relatively low reliability, and face numerous manufacturing challenges.

BRIEF DESCRIPTION OF THE DRAWINGS

Several embodiments of the present disclosure are hereby illustrated in the appended drawings. It is to be noted however, that the appended drawings only illustrate several typical embodiments and are therefore not intended to be considered limiting of the scope of the present disclosure. Further, in the appended drawings, like or identical reference numerals may be used to identify common or similar elements and not all such elements may be so numbered. The figures are not necessarily to scale and certain features and certain views of the figures may be shown as exaggerated in scale or in schematic in the interest of clarity and conciseness.

DETAILED DESCRIPTION

Figure 1:
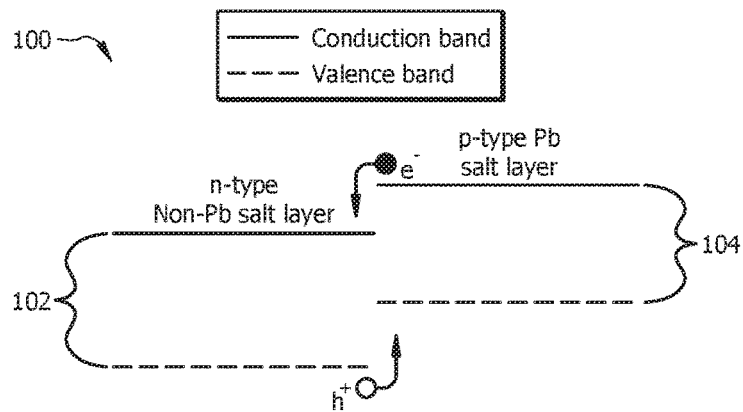
FIG. 1 is a schematic diagram of a non-limiting embodiment of a type II band gap alignment for a PV Pb-salt detector.

Before describing at least one embodiment of the present disclosure in detail by way of exemplary description, drawings, experimentation, and results, it is to be understood that the inventive concepts are not limited in its application to the details of construction and the arrangement of the compositions, steps, or components set forth in the following description or illustrated in the drawings, examples, experiments, and/or results. The presently disclosed inventive concepts are capable of other embodiments or of being practiced or carried out in various ways. As such, the language used herein is intended to be given the broadest possible scope and meaning; and the embodiments are meant to be exemplary, not exhaustive. In addition, it is to be understood that the phraseology and terminology employed herein is for the purpose of description and should not be regarded as limiting except where indicated as such.

Unless otherwise defined herein, scientific and technical terms used in connection with the present disclosure shall have the meanings that are commonly understood by those of ordinary skill in the art. Further, unless otherwise required by context, singular terms shall include pluralities and plural terms shall include the singular. The nomenclatures utilized in connection with, and the laboratory procedures and techniques of, analytical chemistry, and semiconductor production described herein are those well-known and commonly used in the art.

All patents, published patent applications, and non-patent publications mentioned in the specification are indicative of the level of skill of those skilled in the art to which the present disclosure pertains. All patents, published patent applications, and non-patent publications referenced in any portion of this application are herein expressly incorporated by reference in their entirety to the same extent as if each individual patent or publication was specifically and individually indicated to be incorporated by reference.

As utilized in accordance with the present disclosure, the following terms, unless otherwise indicated, shall be understood to have the following meanings: The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or."

Throughout this application, the term "about" is used to indicate that a value includes the inherent variation or error for the device, the method being employed to determine the value, or the variation that exists among the study subjects. For example but not by way of limitation, when the term "about" is utilized, the designated value may vary by plus or minus twenty-five percent, plus or minus twenty percent, plus or minus fifteen percent, plus or minus twelve percent, or plus or minus eleven percent, or plus or minus ten percent, or plus or minus nine percent, or plus or minus eight percent, or plus or minus seven percent, or plus or minus six percent, or plus or minus five percent, or plus or minus four percent, or plus or minus three percent, or plus or minus two percent, or plus or minus one percent, or plus or minus one-half percent.

The use of the term "at least one" will be understood to include one as well as any quantity more than one, including but not limited to, 2, 3, 4, 5, 6, 7, 8, 9, 10, 11, 12, 13, 14, 15, 16, 17, 18, 19, 20, 21, 22, 23, 24, 25, 30, 35, 40, 45, 50, 55, 60, 65, 70, 75, 80, 85, 90, 95, 100, or more. The term "at least one" may extend up to 500 or 1000 or more, depending on the term to which it is attached; in addition, the quantities of 500/1000 are not to be considered limiting, as higher limits may also produce satisfactory results. In addition, the use of the term "at least one of X, Y and Z" will be understood to include X alone, Y alone, and Z alone, as well as any combination of X, Y and Z. The use of ordinal number terminology (i.e., "first", "second", "third", "fourth", etc.) is solely for the purpose of differentiating between two or more items and is not meant to imply any sequence or order or importance to one item over another or any order of addition, for example.

As used in this specification and claims, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

As used herein any references to "one embodiment," "an embodiment," "certain embodiments", or "some embodiments" means that a particular element, feature, structure, or characteristic described in connection with the embodiment is included in at least one embodiment. The appearances of the phrase "in one embodiment" in various places in the specification may not refer to the same embodiment.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

As used herein, the term "substantially" means that the subsequently described event or circumstance completely occurs or that the subsequently described event or circumstance occurs to a great extent or degree. For example, the term "substantially" means that the subsequently described event or circumstance occurs at least 90% of the time, or at least 95% of the time, or at least 98% of the time. In general, the term "substantially" will be understood to allow for minor variations and/or deviations that do not result in a significant impact thereto.

In this detailed description and the appended claims, each numerical value should be read once as modified by the term "about" (unless already expressly so modified), and then read again as not so modified unless otherwise indicated in context. In addition, any range listed or described herein is intended to include, implicitly or explicitly, any number within the range, particularly all integers, including the end points, and is to be considered as having been so stated. For example, "a range from 1 to 10" is to be read as indicating each possible number, particularly integers, along the continuum between about 1 and about 10. Thus, even if specific data points within the range, or even no data points within the range, are explicitly identified or specifically referred to, it is to be understood that any data points within the range are to be considered to have been specified, and that the inventors possessed knowledge of the entire range and the points within the range.

The following elemental abbreviations are used herein: Lead—Pb, Selenium—Se, Tellurium—Te, Sulfur—S, Tin—Sn, Strontium—Sr, Europium—Eu, Germanium—Ge, Cadmium—Cd, Silicon—Si, Carbon—C, Nitrogen—N, Hydrogen—H, Calcium—Ca, Barium—Ba, Fluorine—F, Oxygen—O, Titanium—Ti, Iodine—I, Zinc—Zn, Sodium—Na, Bismuth—Bi, Indium—In, Thallium—Tl, and Antimony—Sb. Where used herein, the notation "IV-VI" refers to a semiconductor material constructed from at least one Group IVA element (e.g., Pb, Sn, Ge) and at least one Group VIA element (e.g., S, Se, Te). Where used herein, the notation "IIB-VI" is intended to refer to a semiconductor material comprising at least one Group IIB element (e.g., Cd, Zn) and at least one Group VIA element. "Pb-salt" refers to a compound comprising lead (e.g., PbSe). "Non-Pb-salt" refers to a compound absent lead (e.g., CdSe).

The embodiments of the present disclosure are not intended to be limiting of the inventive concepts described herein. The following examples and methods describe how to make and use the various aspects of the present disclosure and are to be construed, as noted above, only as illustrative, and not limitations of the disclosure in any way whatsoever. Those skilled in the art will promptly recognize appropriate variations from the embodiments described herein. Without further elaboration, it is believed that one skilled in the art can, using the present description, practice the present disclosure to the fullest extent.

PV detectors may detect light differently in comparison to photoconductive (PC) detectors. PV detectors may be detectors that comprise a p-n junction on which photoelectric current appears upon illumination. Specifically, changes in width of the depletion region at the p-n junction interface within the PV detectors affect the PV detector's generation of photoelectric voltage and/or photoelectric current. For example, when detecting the illumination of one or more wavelengths of light, the PV detector may absorb light photons (e.g. absorb in a Pb-salt layer of a Pb-salt PV detector) that dislodge electrons to create free electrons and holes. The dislodged electrons may have sufficient energy to jump out of the depletion region, which generates a photoelectric current and reduces the width of the depletion region. In contrast, a PC detector detects light using a change of resistance within PC detectors. In other words, a PC detector may function as a resistor whose resistance depends on the detected light intensity.

PV detectors may exhibit other differences when compared to PC detectors. For instance, PV detectors may have a faster response time than PC detectors. Response time for PV Pb-salt material may typically be in a range of tens to hundreds of nanoseconds (ns). Current commercial Pb-salt PC detectors may be resistor-capacitor (RC) lifetime limited, with response time of a PC PbSe detector that ranges about 2-20 microseconds ($\mu s$) and a PC PbS detector of about several hundred $\mu s$. Furthermore, pixel density with PV array could be relatively higher than its PC counterpart, which offers a relatively more compact focal plane array (FPA) system with lower cost. Specifically, IV-VI Pb-salt material may offer low Auger recombination that result in relatively high detectivity for detectors and operating temperature that do not require cooling. Moreover, Pb-salt material may have greater tolerance of defects in comparison to MCT, optimal growth temperature of Pb-salt materials that are below 400 degrees Celsius (° C.), and easier to handle thin film growth (e.g. PbSnSe) than MCT.

Uncooled PV detectors in the mid-IR wavelength range may be less expensive and more compact than detectors with cooled systems. Auger recombination may cause major loss channel at relatively high temperature for current semiconductor mid-IR detectors, and thus may be a hurdle in developing the semiconductor mid-IR detectors. Auger coefficient in Pb-salt materials is more than an order of magnitude lower than those in type-II QWIPs and may suppress Auger recombination relatively to other III-V and II-VI semiconductors with about the same energy band gaps. Additionally, uncooled PbSe PC detectors have demonstrated improvement in specific detectivity (D*) of $2.8 \times 10^{10}$ centimeters (cm) hertz·(Hz)$^{1/2}$/watt (W) and $4.2 \times 10^{10}$ cm·Hz$^{1/2}$/W at ~3.8 $\mu m$, without and with antireflective coating, respectively. However, in terms of PV Pb-salt detectors, utilizing the low Auger recombination trait has somewhat been hindered because of the lack of relatively higher quality junctions with relatively low dark current.

In certain embodiments, IV-VI semiconductors, such as Pb-salt materials may offer high sensitivity similar to MCT. Auger recombination may be one factor in loss channel for mid-wavelength IR (MWIR) and long-wavelength IR (LWIR) (e.g. wavelengths from about 8-15 $\mu m$) detectors. Auger coefficient in IV-VI structures may be more than an order of magnitude lower than those in type-II QWIPs, which in turn may be more suppressed relative to other III-V and II-VI semiconductors with the same energy gaps. Unfortunately, previous IV-VI semiconductors have not been fully realized for detector fabrication because of the inability to produce a relatively high quality p-n junction from diffusion, defects, and/or other material related issues.

One example of a PV Pb-salt detector is a metal semiconductor junction detector that comprises a Pb or Pb-salt Schottky contact junction. However, the performance of such a PV Pb-salt detector is generally below the theoretical limit of Auger recombination. Possible performance enhancement includes improving the Pb-salt material quality improvement or the device junction engineering. In another non-limiting embodiment, the Schottky contact junction may be replaced with a p-n homojunction to lower Auger recombination. However, developing p-n homojunction mid-IR PV detectors may encounter difficulties because of the impurity of inter-diffusion and other material related issues. Another alternative is to construct a larger band gap semiconductor with Pb-salt material to form a p-n heterojunction with proper band offset that is able to offer relatively higher $R_0A$ values by allowing minority carrier transport and blocking the majority carrier leak.

Disclosed herein are various non-limiting embodiments of a PV Pb-salt detector configured to detect light emitted in at least the IR wavelength region of the spectrum, such as mid-IR wavelengths and long/low-wavelength IR wavelengths. In certain non-limiting embodiments, the PV Pb-salt detector of the present disclosure comprises a CSJ structure configured to separate the electrons and holes flowing during illumination of the PV Pb-salt detector. CSJs can be introduced in PV Pb-salt detectors with a IV-VI Pb-salt layer that comprises a material having a polycrystalline, mono-crystalline, or amorphous form. The Pb-salt layer could comprise a bulk form, a microcrystalline form, or nanostructures such as quantum dots, quantum wires, or quantum wells having a 2-dimensional or 3-dimensional form. Examples of Pb-salt materials that may comprise the Pb-salt layers of the present disclosure include, but are not limited to, compounds such as $Pb_xX_{1-x}Se_yTe_{1-y}$, $Pb_xX_{1-x}Se_yS_{1-y}$, and $Pb_xX_{1-x}Te_yS_{1-y}$, wherein X is Sn, Sr, Eu, Ge, or Cd, and wherein $0 \leq x \leq 1$, and $0 \leq y \leq 1$.

Additionally, CSJs may be implemented within PV Pb-salt detectors that comprise a homojunction, a heterojunction, and/or a Schottky contact junction. In another non-limiting embodiment, the PV Pb-salt detector may be a heterojunction PV detector that comprises a non-Pb-salt layer. In some embodiments, the non-Pb-salt layer may be an n-type material that can be selected from a group consisting of, for example, group IIB-VI materials, such as $CdSe_{1-x}S_x$, $Cd_xZn_{1-x}Se_yS_{1-y}$, wherein $0 \leq x \leq 1$ and $0 \leq y \leq 1$, ZnO, and oxides such as $TiO_2$, and any other materials that satisfy the type IIB band gap as shown in FIG. 1, including ternary and quaternary compounds.

Throughout the present disclosure, the term "polycrystalline" may refer to a solid material (e.g. Pb-salt layer) that comprises a plurality of crystallites of varying size and orientation. Areas where the crystallites meet may be known by persons of ordinary skill in the art as grain boundaries. Persons of ordinary skill in the art are also aware that the term "crystallites" may be interchangeably referred to as grains or microcrystals. In certain embodiments, the layer of polycrystalline material is a thin film material defined as having boundary domains existing along at least one dimension between crystallites therein. The size of crystallites in the layer of polycrystalline material can be in micro- or nano-meter scale. For example, thin films comprising one-dimensional column crystals (either in micro- or nano-scale) are considered polycrystalline thin film materials. A polycrystalline IV-VI Pb-salt layer, in some embodiments, may comprise crystallites with sizes that range from about 1 nm to about 10 µm.

The plurality of microcrystals of the polycrystalline layer may have boundary domains, due to different orientations of the microcrystals, forming divisions between the plurality of microcrystals. In some embodiments, the plurality of microcrystals, forming the layer of polycrystalline material 40 may be about 1 µm in size and about 1 µm in thickness. It should be noted that the shape of the microcrystal (crystallite) is cubic or near-cubic. The "size" of such crystallite (e.g., length, width or height) could range from 100 nm to a few micrometers, and common sizes are in a range from about 100 nm to about 1000 nm. The size, however, can be controlled using known techniques, to grow one-dimensional column-like crystals, in which the crystallite has a square base with a length and/or width in the range of about 1 nm to about 2000 nm and a height in a range from about 1 nm to about 10,000 nm (10 mm). In principle, height can be even higher than 10 mm. In some other embodiments, the plurality of microcrystals forming the layer of polycrystalline material may be about 100 nm or about 500 nm in size.

In certain embodiments of the present disclosure, each microcrystal of the plurality of microcrystals forming the layer of polycrystalline material may have a width in a range of from about 50 nm to about 1 µm (in the horizontal direction). In some embodiments, each microcrystal of the plurality of microcrystals may have a height in a range of from about 1 µm to about 10 µm (in the vertical direction), such that the polycrystalline material comprising the microcrystals has a thickness in a range of from about 50 nm to about 1 µm to about 10 µm. The layer of polycrystalline material may be sensitized to enhance or create an ability to receive and interact with light. The layer of polycrystalline material may be sensitized for example by annealing the polycrystalline material under a predetermined atmosphere. In some embodiments, the predetermined atmosphere may be an Iodine atmosphere followed by an Oxygen atmosphere.

In certain non-limiting embodiments of the present disclosure, the layers of polycrystalline material may be sensitized by heating for about 10-60 minutes at temperatures between 420° C. and 450° C. followed by iodine vapor carried by nitrogen gas or oxygen with a 5-50 sccm flow at 350° C.-390° C. for 10-30 minutes. In one embodiment, the sensitization process uses pure oxygen in a first step to improve the crystal quality. The $O_2$ annealing temperature in certain embodiments is in a range of about 375° C. to about 385° C., for example about 380° C., and annealing time, in certain embodiments, is in a range of about 20 min to about 30 min, for example about 25 min. The annealing time can vary depend on the size of the crystallites. After this step, $I_2$ is introduced for about 3 min to about 10 min, for example about 5 min, to sensitize the material. Again, the optimized temperature for $I_2$ annealing may vary depending on the size of the crystallites and the surface conditions after the $O_2$ annealing step. The temperature for the iodine step may be in a range of about 375° C. to about 385° C., for example about 380° C. In one embodiment, the sensitization method includes exposing a lead salt-coated substrate to an oxygen atmosphere or nitrogen atmosphere or an oxygen-nitrogen atmosphere for a duration of time in a range of about 10 minutes to about 30 minutes at a temperature in a range of about 350° C. to about 390° C., followed by a step of exposing the lead salt-coated substrate to an iodine vapor for a duration of time in a range of about 3 minutes to about 10 minutes at a temperature in a range of about 350° C. to about 390° C., forming a sensitized lead salt-coated substrate.

The term "mono-crystalline" may refer to a solid material (e.g. Pb-salt layer) in which the crystal lattice of an entire sample is substantially continuous and substantially unbroken to the edges of the sample. The mono-crystalline material may include no or relatively little number of grain boundaries and may be substantially uniform. Additionally, for this disclosure, the term "heterojunction" may refer to a junction that occurs between layers or regions of dissimilar semiconductor material. In particular to a p-n junction, a heterojunction comprises different n-type and p-type material that have different energy band gaps. The term "homojunction" refers to a junction that occurs between layers or regions that have substantially similar semiconductor material. Typically, the substantially similar semiconductor materials may have about equal band gaps. Specifically, in a p-n junction, a homojunction may comprise substantially the same n-type material (e.g. PbSe material layer) and p-type material (e.g. PbSe material layer).

In some embodiments of the present disclosure, the detector is connected, e.g., via lead wires to an electrical system. In some embodiments, the electrical system may be implemented as a readout integrated circuit (ROIC), electronics configured to receive information indicative of patterns in electron strikes, a computer system, or any other suitable electrical system capable of receiving electrical signals, voltages, and/or information generated from the detectors. Where implemented as a computer system, the electrical system may include at least one processor capable of executing processor executable instructions, a non-transitory processor readable medium capable of storing processor executable instructions, an input device, an output device, and a communications device, all of which may be partially or completely network-based or cloud based, and may not necessarily be located in a single physical location.

Where implemented as a computer system, the processor of the electrical system can be implemented as a single processor or multiple processors working together to execute processor executable instructions including the logic described herein. Exemplary embodiments of the processor may include a digital signal processor (DSP), a central processing unit (CPU), a field programmable gate array (FPGA), a microprocessor, a multi-core processor, a quantum processor, application-specific integrated circuit (ASIC), a graphics processing unit (GPU), a visual processing unit (VPU) and combinations thereof. The processor is operably coupled with the non-transitory processor readable medium via a path which can be implemented as a data bus allowing bi-directional communication between the processor and the non-transitory processor readable medium, for example. The processor is capable of communicating with the input device and with the output device via additional paths, which may be one or more data busses, for example. The processor may be further capable of interfacing and/or bi-directionally communicating with a network using the communications device, such as by exchanging electronic, digital, analogue, and/or optical signals via one or more physical, virtual, or logical ports using any desired network protocol such as TCP/IP, for example. It is to be understood that in certain embodiments using more than one processor, multiple processors may be located remotely from one another, located in the same location, or comprising a unitary multi-core processor. The processor is capable of reading and/or executing processor executable code stored in the one or more non-transitory processor readable medium and/or of creating, manipulating, altering, and storing computer data structures into the one or more non-transitory processor readable medium.

Where implemented as a computer system, the non-transitory processor readable medium of the electrical system may store a program having processor executable instructions configured to receive and interpret electrical signals, voltages, and/or information received from two or more spaced apart electrical contacts. The processor executable instructions may also be configured to provide signal processing when the detector is implemented as an array, for example. The non-transitory processor readable medium may be implemented as any type of memory, such as random access memory (RAM), a CD-ROM, a hard drive, a solid state drive, a flash drive, a memory card, a DVD-ROM, a floppy disk, an optical drive, and combinations thereof, for example. While the non-transitory processor readable medium may be located in the same physical location as the processor, the non-transitory processor readable medium may also be located remotely from the processor and may communicate with the processor via the network. Additionally, when more than one non-transitory processor readable medium is used, one or more non-transitory processor readable medium may be located in the same physical location as the processor, and one or more non-transitory processor readable medium may be located in a remote physical location from the processor. The physical location of the non-transitory processor readable medium can be varied, and the non-transitory processor readable medium may be implemented as a "cloud memory" i.e., one or more non-transitory processor readable medium which is partially, or completely based on or accessed using the network, for example. Further, the one or more processors may not communicate directly with the non-transitory processor readable medium, but may communicate with another processor communicating with the non-transitory processor readable medium over the network, for example. In some exemplary embodiments, the processor may include a first processor communicating with a second processor executing processor executable instructions including the word recognition and media insertion program over the network. The second processor may be part of a computer station, or may be a part of a separate computer system or server configured to communicate with the computer system over the network or otherwise operably coupled with the computer system, for example.

Where the electrical system is implemented as a computer system, the input device may pass data to the processor, and may be implemented as a keyboard, a mouse, a touchscreen, a camera, a cellular phone, a tablet, a smart phone, a personal digital assistant (PDA), a microphone, a network adapter, the photodetector, and combinations thereof, for example. The input device may also be implemented as a stylus, a mouse, a trackball, and combinations thereof, for example. The input device may be located in the same physical location as the processor, or may be remotely located and/or partially or completely network-based.

More particularly, as described in further detail below, in one non-limiting embodiment, the disclosure includes an IR photovoltaic (PV) detector, comprising a IV-VI Lead (Pb)-salt layer disposed on a substrate; and a charge-separation-junction (CSJ) structure disposed on or embedded in the IV-VI Pb-salt layer, wherein the CSJ structure comprises a plurality of element areas disposed upon or within the IV-VI Pb-salt layer, wherein the plurality of element areas are substantially parallel to each other, wherein each element area is connected to a first Ohmic contact thereby forming a plurality of interconnected first Ohmic contacts, and wherein a second Ohmic contact is disposed upon a portion of the IV-VI Pb-salt layer.

In another non-limiting embodiment, the disclosure includes a photovoltaic PV detector, comprising a heterojunction region that comprises at least one IV-VI Pb-salt material layer coupled to at least one non-Pb-salt layer, wherein the at least one IV-VI Pb-salt layer and the at least one non-Pb-salt layer form a p-type-n-type (p-n) junction with a type II band gap alignment, and wherein the type II band gap alignment is arranged such that a conduction band of an n-type material of the p-n junction is about equal to or at a relatively lower energy level than the conduction band of the p-type material of the p-n junction.

Another non-limiting embodiment of the present disclosure includes an apparatus for detecting infrared light, comprising a IV-VI Pb-salt layer disposed on a substrate, a plurality of junction layers applied to an upper surface of the IV-VI Pb-salt layer to form a plurality of junctions that are either a p-n junction or a Schottky contact junction, one or more junction electrical contacts that are interconnected with each other and applied to the upper surface of the junction layers, one or more Pb-salt electrical contacts that are interconnected with each other and applied to the upper surface of the IV-VI Pb-salt layer, wherein the junctions generate a photoelectric current upon illumination of the junctions and absorbed by IV-VI Pb-salt layer, and wherein the junction electrical contacts and the Pb-salt electrical contacts collect a plurality of free electrons and a plurality of free holes upon illumination of the junctions and absorbed by IV-VI Pb-salt layer.

Referring now to the drawings, FIG. 1 is a schematic diagram of a non-limiting embodiment of a type II band gap alignment for a PV Pb-salt detector 100. In particular, FIG.

1 illustrates an n-type non-Pb-salt layer band gap 102 and a p-type Pb-salt layer band gap 104 for the PV Pb-salt detector 100. To form the p-n junction, the n-type non-Pb-salt layer may be coupled to the p-type Pb-salt layer. The p-type Pb-salt layer may be deposited as a mono-crystalline material, a polycrystalline material, or an amorphous material. As a polycrystalline material, the Pb-salt layer may comprise crystallites with sizes that range from about 1 nm to about 10 µm, or other sizes described elsewhere herein. Using a polycrystalline Pb-salt material may provide for a relative higher material quality in comparison to a mono-crystalline Pb-salt layer. Conversely, a mono-crystalline may provide for a relatively more uniform Pb-salt layer and typically produces a relatively easier contact surface.

Throughout the present disclosure, it is noted that in certain embodiments of detectors described herein, the non-Pb-salt layer or layers may have wider band gaps than the Pb-salt layer or layers therein.

FIG. 1 illustrates that the p-n junction may have type II band gap alignment such that the energy level for the conduction band of the n-type non-Pb-salt layer is about equal to or less than the energy level for the conduction band of the p-type Pb-salt layer. In FIG. 1, when the Pb-salt layer is a p-type layer, the conduction band is relatively higher or more than the energy level of the conduction band of the n-type non-Pb-salt layer. The type II band gap alignment, as shown in FIG. 1, may be used to perform photo-detection such that free electrons and holes may travel through the n-type non-Pb-salt layer and p-type Pb-salt layer, respectively, to generate photoelectric current. In certain embodiments, a different type II band gap alignment where the conduction band for the p-type Pb-salt layer is lower than n-type non-Pb-salt material layer may not be suitable for photo-detection.

Additionally, other types of band gap alignments may also exist that are not suitable for photo-detection as a type II band gap alignment. In certain embodiments, band gap alignments that have the energy level for the conduction band of the n-type layer relatively more or higher than the energy level for the conduction band of the p-type layer may not be used for photo-detection. One example of the type of band gap alignment that may not be suitable for PV photo-detection is a type-I band gap alignment. A type-I band gap alignment may occur when the band gap of one of the materials (e.g. the n-type non-Pb-salt layer) completely overlaps the band gap of another material (e.g. p-type Pb-salt material layer). In relation to a p-n junction, the valence band for the n-type layer is at a relatively lower energy than the valence band of the p-type layer, and the conduction band for the n-type layer is at a relatively higher energy than the conduction band of the p-type layer. For example, a heterojunction that comprises a p-type PbSe and an n-type ZnO structure may not be used for detector applications because the band gap of the n-type ZnO may have band gap that overlaps the p-type PbSe.

In one non-limiting embodiment, the wider band gap n-type material could be replaced with Ohmic contact materials that contact the Pb-salt materials where wider band gap material is not used to form p-n junction within the PV Pb-salt detector 100. The Ohmic contact material, which may have a narrower band gap than the Pb-salt layer, and the Pb-salt material may form an Ohmic contact. Moreover, the PV Pb-salt detector 100 may have cutoff wavelengths that fall within the Pb-salt absorption range, which is typically about 0.5 µm to about 32 µm. For example, the PV Pb-salt detector 100 or any detector described herein may be configured with cutoff wavelengths that fall within the ranges of about 0.5-5 µm, 3-5 µm, 3-8 µm (e.g. mid-IR or MWIR), 3-12 µm, 5-12 µm, 8-12 µm, 8-15 µm (e.g. LWIR), 10-16 µm, 12-18 µm, 8-20 µm, or any other set of wavelengths within the range of about 0.5 µm to about 32 µm.

In one non-limiting embodiment, the p-n junction may have type II band gap alignment, as shown in FIG. 1, using a heterojunction. In heterojunction PV detectors, the layers that create the junction may have dissimilar crystalline structure. For example, rather than using two IV-VI layers in a homojunction, a II-VI layer and a IV-VI layer could be used to form the heterojunction. In certain embodiments, heterojunctions may offer advantages over homojunctions. For example, in comparison to homojunctions, heterojunctions may have relatively less diffusion of dopant materials between heterojunction layers. The lesser diffusion of dopant material may maintain a well-defined interface between the two layers to maintain the p-n junction behavior of the semiconductor. In addition, heterojunctions may be easier to fabricate because certain n-type materials can be applied via wet chemical methods (e.g. chemical bath deposition (CBD)). Non-limiting examples of n-type materials that can be used include CdS, ZnO, and $TiO_2$. When a CdS, CdSe, $CdSe_{1-x}S_x$, ZnO, or $TiO_2$ material, for example, is selected as the n-type material, the layer of the n-type material may be grown directly on a substrate with a readout circuit via CBD to create relatively large format FPAs with relatively high detectivity. The PV detector 100 may also be constructed on a planar or non-planar (e.g., wire or quantum dot) substrate.

In one non-limiting embodiment, the PV Pb-salt detector 100 may further comprise a charge-separation-junction (CSJ) structure comprising a plurality of charge-separation-junctions. The CSJ structure may be disposed on or embedded in a semiconductor layer, such as an epitaxial layer. The PV Pb-salt detector 100 may comprise IV-VI Pb-salt materials, which are used herein as non-limiting examples. IV-VI Pb-salt materials offer advantages in the long wavelength regime of enhancement of the Auger non-radiative lifetime. The low Auger recombination results in a relatively increase in detector performance, such as relatively high detectivity and relatively high operating temperature. The use of a CSJ structure within a PV Pb-salt detector 100 may be used to prevent low carrier lifetime because of, for example, Schokley-Reed-Hall recombination. The CSJs may in effect separate the electrons and holes in mono-crystalline, polycrystalline, or amorphous Pb-salt materials to prevent recombination.

The PV Pb-salt detector 100 may be a single element detector that may comprise a plurality of CSJs embedded in a single semiconductor layer (e.g. Pb-salt layer), which could be a p-type or n-type material, and comprises a plurality of p-n junctions effectively embedded within the single semiconductor layer. The single semiconductor layer may be coupled substantially parallel to a substrate. Each p-n junction comprises a pair of Ohmic contacts isolated from each other, wherein all of the p-type contacts are interconnected and all of the n-type contacts are interconnected to form the single element detector, which may correspond to detecting a pixel. The photo-induced electrons and holes may be spatially separated by the built-in potential and carrier lifetimes to separate electron-hole pairs in space and lower the recombination rate. For instance, CSJs may alleviate short-carrier lifetime (<10 ns) which may be a problem for Pb-salt layers, such as a PbSe layer, grown on Si substrates. Introducing CSJs within PV Pb-salt detectors will be discussed in more detail in the description regarding FIGS. 4-9.

Figure 2:
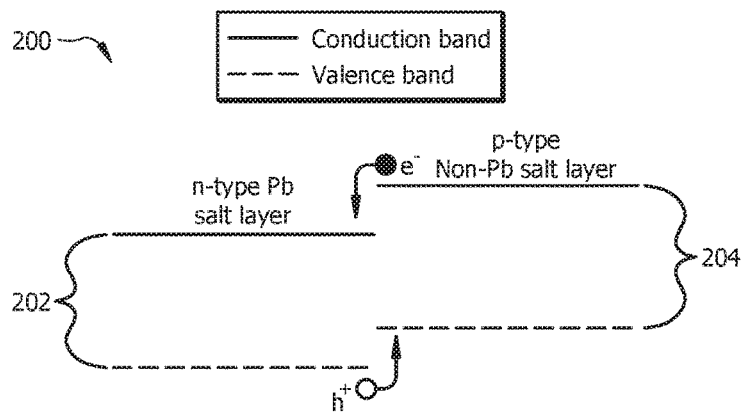
FIG. 2 is a schematic diagram of another non-limiting embodiment of a type II band gap alignment for a PV Pb-salt detector.

FIG. 2 is a schematic diagram of a non-limiting embodiment of a type II band gap alignment for a PV Pb-salt detector 200. In contrast to FIG. 1, FIG. 2 illustrates an n-type Pb-salt layer band gap 202 and a p-type non-Pb-salt layer band gap 204 for the PV Pb-salt detector 200. The n-type Pb-salt layer and the p-type non-Pb-salt layer may be coupled together to form the p-n junction. The n-type Pb-salt material may be deposited as a mono-crystalline material, polycrystalline material, or an amorphous material. As a polycrystalline material, the Pb-salt layer may comprise crystallites with sizes as described elsewhere herein. As noted above, a polycrystalline Pb-salt material may provide for a relative higher material quality in comparison to a mono-crystalline Pb-salt material. Conversely, a mono-crystalline may provide for a relatively more uniform Pb-salt layer and typically produces a relatively easier contact surface. Similar to the PV Pb-salt detector 100 in FIG. 1, the PV Pb-salt detector 200 may further comprise a plurality of CSJs.

As shown in FIG. 2, the p-n junction formed between the n-type Pb-salt layer and the p-type non-Pb-salt layer may have type II band gap alignment such that the energy level for the conduction band of the n-type Pb-salt layer is about equal to or less than the energy level for the conduction of the p-type non-Pb-salt layer. As noted above, to perform photodetection the p-type layer's (e.g., p-type non-Pb-salt layer) conduction band may be about equal or relatively higher than the energy level of the conduction band of the n-type layer (e.g. n-type Pb-salt layer). In one non-limiting embodiment, the wider band gap p-type non-Pb-salt layer could be replaced with Ohmic contact materials that contact the Pb-salt layer when the wider band gap material is not used to form p-n junction within the PV Pb-salt detector 200. The Ohmic contact material, which may have a narrower band gap than the Pb-salt layer, and the Pb-salt layer may form an Ohmic contact.

Figure 3:
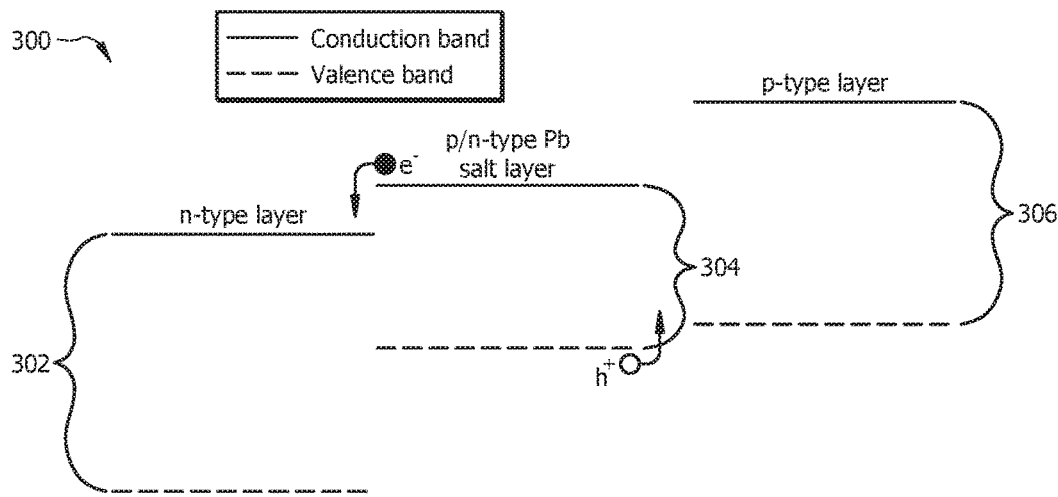
FIG. 3 is a schematic diagram of a non-limiting embodiment of a type II band gap alignment for a double heterojunction PV Pb-salt detector.

FIG. 3 is a schematic diagram of a non-limiting embodiment of a type II band gap alignment for a double heterojunction PV Pb-salt detector 300. FIG. 3 illustrates a n-type layer band gap 302, a p/n-type Pb-salt layer band gap 304, and a p-type layer band gap 306 for the double heterojunction PV Pb-salt detector 300. In one non-limiting embodiment, the double heterojunction PV Pb-salt detector 300 may comprise a plurality of CSJs that form a CSJ structure. As shown in FIG. 3, the Pb-salt material could be p-type and n-type within the double heterojunction PV Pb-salt detector 300. In other words, two p-n junctions may be formed within the double heterojunction PV Pb-salt detector 300 when the Pb-salt layer is either a p-type or an n-type. For example, the portion of the Pb-salt layer that is a p-type material may be coupled to an n-type material to form a p-n junction. Moreover, the portion of the Pb-salt layer that is an n-type material may be coupled to a p-type material to form another p-n junction.

Certain examples described herein are non-limiting examples of embodiments of the processes of the present disclosure, which may be applicable to other PV detectors. For example, instead of a PV detector that comprises a p-n junction, one non-limiting embodiment of the PV detector may comprise a Schottky contact junction used for photodetection. The PV detector with the Schottky contact junction may comprise a Pb-salt layer that may be n-type or p-type and may comprise polycrystalline material, monocrystalline material, and amorphous material. Moreover, it is understood that the present disclosure is not limited in its application to the specific examples, experimentation, results and laboratory procedures described herein. Rather, the examples are simply provided as several of various embodiments and are meant to be exemplary and not exhaustive.

Figure 4:
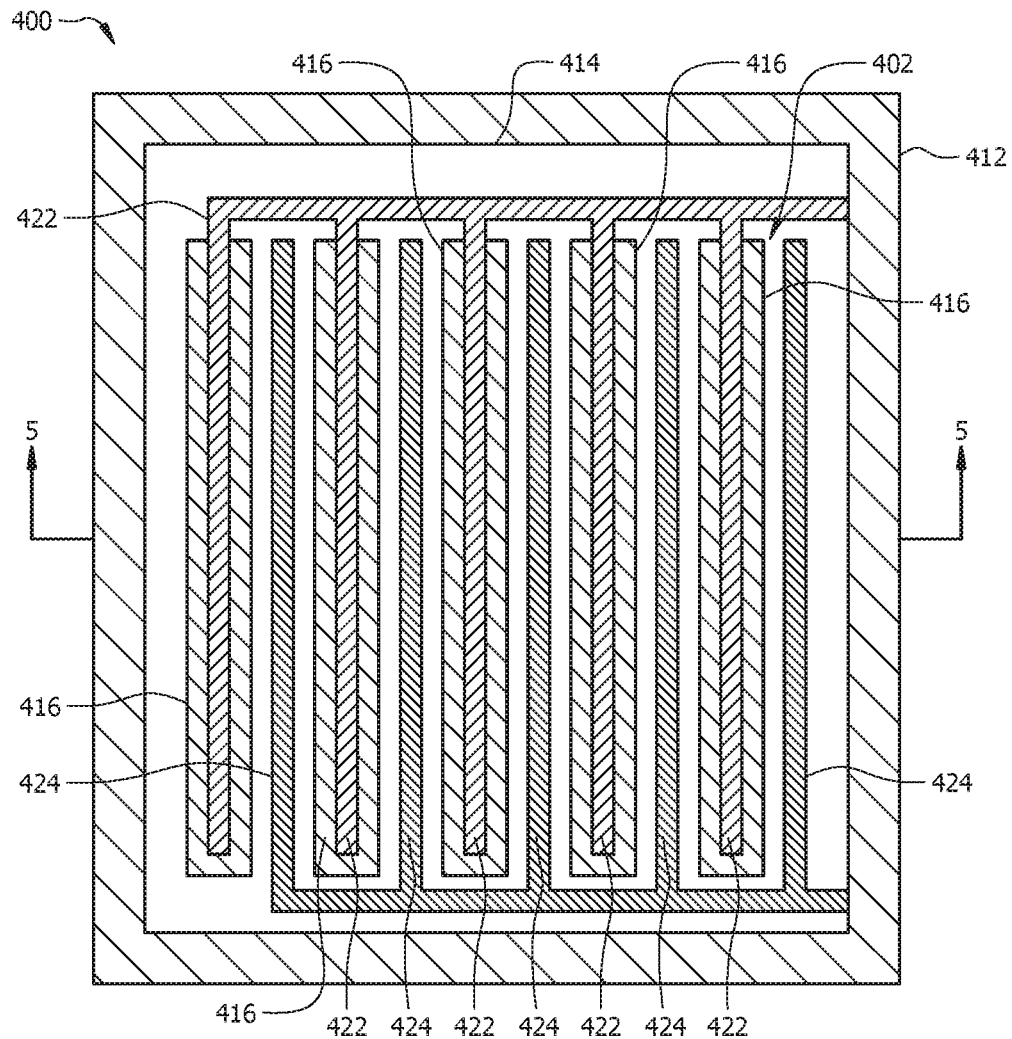
FIG. 4 is a schematic diagram of a top-down view of a non-limiting embodiment of a PV Pb-salt detector that comprises a two-dimensional charge separation junction (CSJ) structure.

FIG. 4 is a schematic diagram of a top-down view of a non-limiting embodiment of a PV Pb-salt detector 400 that comprises a two-dimensional CSJ structure 402. PV Pb-salt detector 400 comprises a substrate 412, such as a silicon substrate (or other substrate material described herein), having disposed thereon a single Pb-salt layer 414. The substrate 412 could be any suitable material that include, but are not limited to Si, silica, $SiO_2$ glass, $BaF_2$, quartz, sapphire, and conductive transparent oxides. The substrate 412 could be a planar or non-planar (e.g., wire, curved, or quantum dot) substrate. The PV Pb-salt detector 400 is also depicted in cross-section in FIG. 5. The single Pb-salt layer 414 may be mono-crystalline or polycrystalline material and may be epitaxial. The single Pb-salt layer 414 may be a continuous layer that is disposed on the substrate 412. In at least one non-limiting embodiment, the single Pb-salt layer 414 may be any IV-VI Pb-salt material described herein, such as PbSe, and may comprise a p-type dopant material. The CSJ structure 402 comprises a plurality of element areas 416, each comprising an n-type material, that are disposed upon the single Pb-salt layer 414. The plurality of element areas 416 are spaced apart and may be substantially parallel to each other and may be substantially parallel to the surface of the substrate 412 upon which the single Pb-salt layer 414 is disposed. The element areas 416 may have the shapes of, but are not limited to strips, wires (e.g., nanowires), tubes, or dots.

The substrate 412 may be any substrate material discussed herein, including, but not limited to: a silicon substrate, such as a monocrystalline silicon substrate; a silicon micro-lens; a mid-infrared transparent substrate; an infrared transparent substrate; a substrate transparent to light in a visible portion of the light spectrum; a polyimide substrate developed for solar cell applications; a monocrystalline semiconductor material; or other monocrystalline or polycrystalline substrates. The substrate 412 can be constructed of a monocrystalline or polycrystalline material such as, but not limited to, Si (e.g., monocrystalline silicon), glass, silica, $SiO_2$, quartz, sapphire, $CaF_2$, amorphous materials such as glass, conductive transparent (in visible) materials such as fluorine doped Tin Oxide, or Indium Tin Oxide. In some embodiments, the substrate 412 may be constructed as a cylinder. The substrate 412 may be constructed in a variety of different manners and may have a variety of shapes, such as planar, curved, or a combination of planar and curved portions and may be rigid or flexible. In some embodiments, the substrate 412 may be able to pass light of the wavelengths or wavelength ranges to be detected by the photodetector.

Each element area 416 may have an n-type Ohmic contact 422 disposed thereon to form a plurality of interconnected n-type Ohmic contacts 422. Further, a p-type Ohmic contact 424 may be disposed upon a portion of the single Pb-salt layer 414 to form a plurality of interconnected p-type Ohmic contacts 424. As shown in FIG. 4, the layout of the n-type Ohmic contact 422 and the p-type Ohmic contact 424 may form a finger-like structure. The p-type Ohmic contacts 424 may be located between adjacent element areas 416 to form a plurality of interconnected p-type Ohmic contacts 424, and the n-type Ohmic contacts 422 may be located on top of each element area 416 to form a plurality of interconnected n-type Ohmic contacts 422. While the single Pb-salt layer 414 is referred to in this example as constructed of a p-type material, and the overlaying element areas 416 are referred to as constructed of an n-type material, it will be understood that the materials could be switched, such that the Pb salt layer 414 comprises an n-type material and the element areas 416 comprise a p-type material instead.

The junctions of the present PV Pb-salt detectors can be formed by n-type doping, p-type doping, by having Schottky junctions, or by heterojunction. The Ohmic contacts 422 and 424 may be constructed of gold (Au), silver (Ag) or any other suitable conductive material known by persons having ordinary skill in the art of IV-VI semiconductor construction. It is also to be understood that the Pb-salt layer may be formed by any appropriate deposition method known in the art, including, but not limited to an epitaxial deposition method such as molecular beam epitaxy or chemical vapor deposition (CVD). Further, the CSJs of any of the presently disclosed inventive concepts described herein can be used on planar or non-planar (e.g., curved) substrates.

Figure 5:
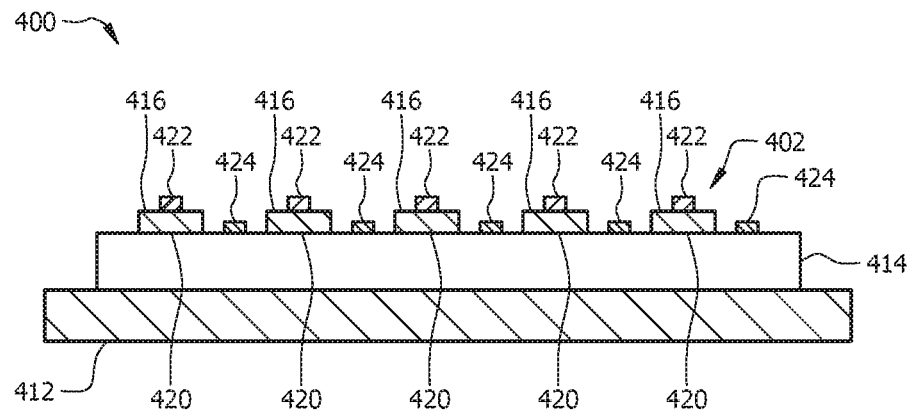
FIG. 5 is a cross-sectional view, taken along line 5-5 in FIG. 4, of the PV Pb-salt detector shown in FIG. 4.

FIG. 5 is a cross-sectional view of the PV Pb-salt detector 400 that comprises a two-dimensional CSJ structure 402. As noted above, the CSJ structure 402 of the PV Pb-salt detector 400 comprises element areas 416 that comprise n-type (or p-type) material that may be shaped as strips, wires, tubes, or dots, for example. Each of the element areas 416 may be disposed on top of a portion of the single Pb-salt layer 414. A p-type Ohmic contact 424 may be positioned on the Pb-salt layer 414 between adjacent element areas 416. Moreover, an n-type Ohmic contact 422 may be coupled to or contact the element area 416. In another non-limiting embodiment, the n-type material may be embedded in a layer of p-type single Pb-salt layer 414 (or n-type, respectively), such as PbSe, which form a plurality of p-n junctions within the p-type Pb-salt layer 414. Embedding n-type material in a layer of p-type single Pb-salt layer 414 (or n-type, respectively) is described in more detail below in FIGS. 8 and 9. In one non-limiting embodiment where the element areas 416 are a metal material, Schottky contact junctions 420 are formed instead of p-n junctions 420.

When light-photons are absorbed by the single Pb-salt layer 414, the built-in potential of the p-n junctions 420 may spatially separate the electrons and holes at a relatively faster rate than Auger and radiative recombination. The p-n junctions 420 may be used to enhance carrier lifetime. Under bias, the photon-induced electrons and holes may subsequently be transported to the Ohmic contacts 422 and 424. Specifically, the n-type Ohmic contact 422 may be used to collect the free holes and the p-type Ohmic contact 424 may be used to collect the free electrons. The p-n junctions 420 and the Ohmic contacts 422 and 424 may be located within the diffusion length of the majority carriers. By collecting the free electrons and holes while separated within the CSJs, the PV Pb-salt detector 400 may avoid, reduce or minimize the possibility of recombination.

FIG. 5 illustrates an embodiment wherein diffusion of dopant material from the n-type material into the p-type material, and vice-versa, is absent or minimal at the p-n junction 420. Minimal diffusion of dopant material may maintain a relatively well-defined interface between the element areas 416 and the Pb-salt layer 414 in order to maintain the p-n junction behavior of the semiconductor. For example, heterojunctions and Schottky contact junctions generally have reduced diffusion of dopant materials at the junction layers in comparison to homojunctions.

Figure 6:
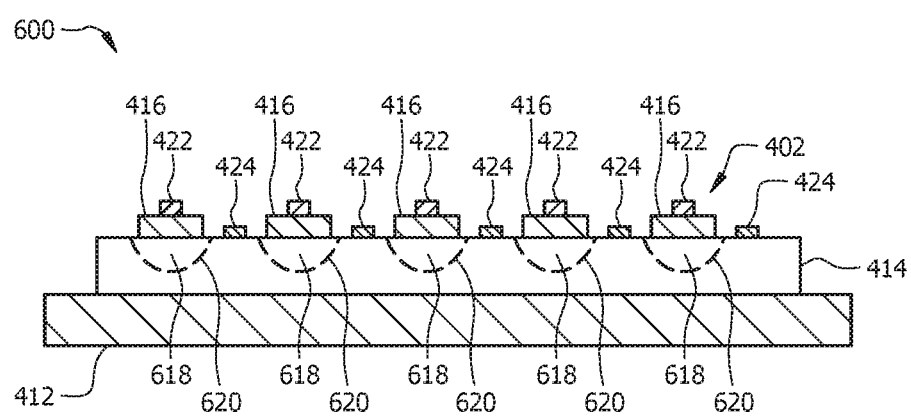
FIG. 6 is a cross-sectional view of a PV Pb-salt detector similar to the PV Pb-salt detector shown in FIG. 4, further comprising a plurality of dopant diffusion regions beneath element areas therein.

FIG. 6 is cross-sectional view taken through a PV Pb-salt detector 600, which is similar to PV Pb-salt detector 400 except it comprises a CSJ structure 402 comprising element areas 416 and a plurality of dopant diffusion regions 618. The CSJ structure 402 may be able to separate out electrons and holes and avoid recombination when dopant diffusion regions 618 are embedded within the single Pb-salt layer 414. The dopant diffusion regions 618 may occur when the p-n junctions are homojunctions. FIG. 6 illustrates that the constituents of each element area 416 with n-type material may diffuse into a portion of the single p-type Pb-salt layer 414 thereby forming a plurality of n-type dopant diffusion regions 618. The n-type dopant diffusion regions 618 in the p-type Pb-salt layer 414 may be located below and/or surround each element area 416 such that a plurality of substantially parallel p-n junctions 620 are formed in the p-type Pb-salt layer 414. The dopant diffusion regions 618 may also be referred to herein as charged zones or depletion zones. The p-n junctions 620 are located where the n-type dopant diffusion regions 618 meet the p-type Pb-salt layer 414. Alternatively, the element areas 416 may comprise a p-type material and the Pb-salt layer 414 may comprise an n-type material wherein the dopant diffusion regions 618 comprise p-type dopant.

Figure 7:
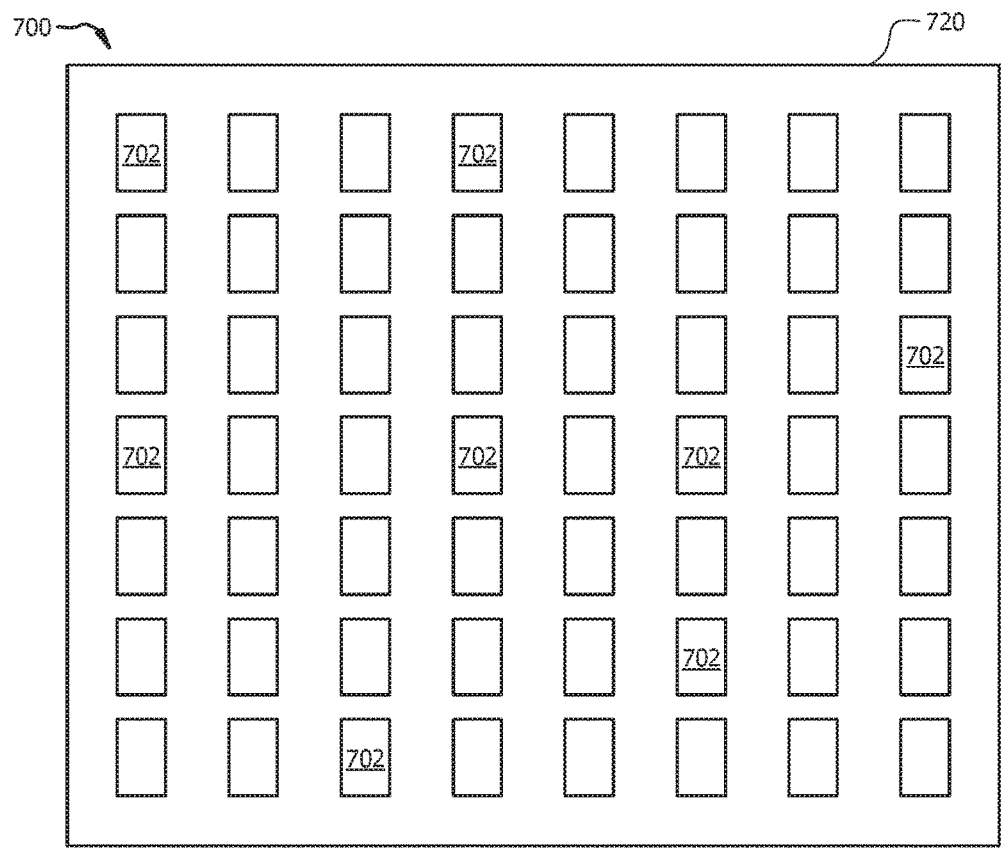
FIG. 7 is a schematic diagram of a non-limiting embodiment of a focal plane array (FPA) comprising a plurality of photodetectors of the present disclosure.

FIG. 7 is a schematic diagram of a non-limiting embodiment of a FPA 700 used for photo-detection. The FPA 700 may be constructed to comprise an array substrate 720, a plurality of PV Pb-salt detectors 702 that are disposed on an upper surface of the array substrate 720. The PV Pb-salt detectors 702 may correspond to the PV Pb-salt detectors 400 in FIG. 4 or the PV Pb-salt detector 800 in FIG. 8 or any other detectors described herein. In one non-limiting embodiment, the PV Pb-salt detector 702 may correspond to a pixel of the FPA 700. Each of the PV Pb-salt detectors 702 may collect photons to correspond to a particular area of an image. The FPA 700 may further comprise a Readout Integrated Circuit (ROIC) or some other read out circuit (not shown in FIG. 7) configured to provide the analog electrical signals (e.g. photoelectric current and/or voltage) from the PV Pb-salt detectors 702 to one or more signal processors to generate digital images and determine which IR signatures the PV Pb-salt detectors 702 are receiving.

Figure 8:
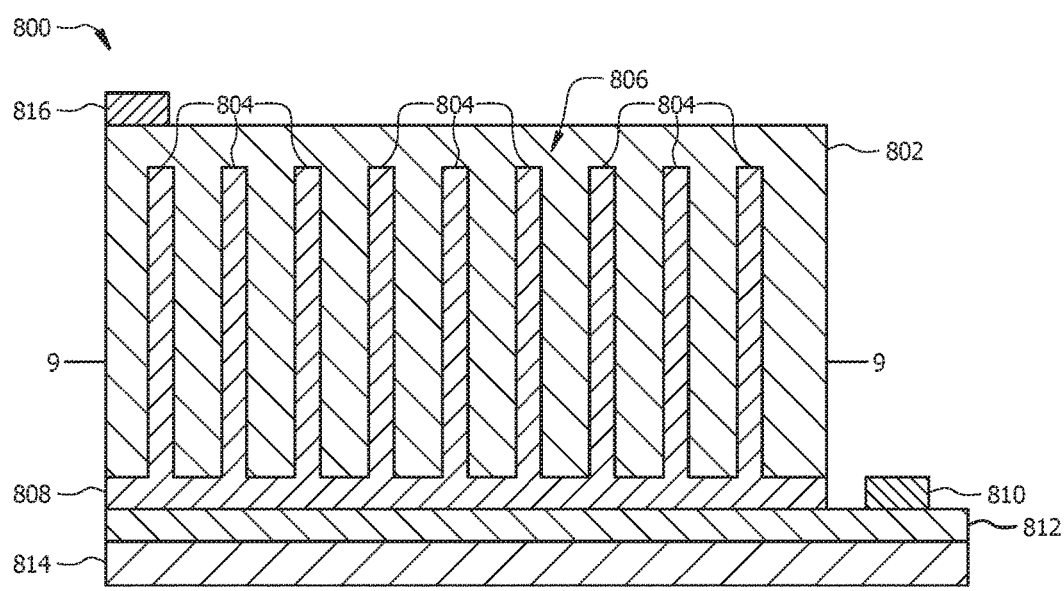
FIG. 8 is a schematic diagram of a side view of a non-limiting embodiment of a PV Pb-salt detector that comprises a three-dimensional charge separation junction structure.

FIG. 8 is a schematic diagram of a side view of a non-limiting embodiment of a PV Pb-salt detector 800 that comprises a three-dimensional CSJ structure 806 that comprises a plurality of vertically oriented element areas 804. The PV Pb-salt detector 800 is constructed of a substrate 814, a conducting layer 812 (also referred to herein as an Ohmic contact layer) disposed upon the substrate 814, and a Pb-salt layer 802. Embedded within the Pb-salt layer 802 is the plurality of vertical element areas 804 (which may be, but are not limited to strips, wires (nanowires), tubes, stumps, rods, and dots) that extend substantially vertically (perpendicularly) into the Pb-salt layer 802 from a base 808. The base 808 may comprise substantially the same material as the vertical element area 804. Element areas 804 may be semiconductor or metal material or any material described herein for forming element areas of the CSJ structures described herein. The base 808 is disposed upon the conducting layer 812, and the Pb-salt layer 802 is disposed upon the base 808.

In the PV Pb-salt detector 800, the plurality of vertical element areas 804 of the CSJ structure 806 are embedded within the Pb-salt layer 802. Junctions, such as p-n junctions and Schottky contact junctions, may be formed by embedding the element areas 804 within the Pb-salt layer 802. A first Ohmic contact 816, for example, constructed of Au or any suitable conductive material, is attached to a portion of the Pb-salt layer 802 and a second Ohmic contact 810, for example, constructed of Au, or any suitable conductive material, is attached to an exposed portion of the conducting layer 812. In one non-limiting embodiment when the Pb-salt layer 802 is a p-type material, the first Ohmic contact 816 may be configured as a positive terminal that collects free electrons and the second Ohmic contact 810 may be configured as a negative terminal that collects free holes to avoid recombination.

The Pb-salt layer 802, in one non-limiting embodiment, comprises a p-type material (e.g. PbSe, Pb-salt layer 414, and/or other Pb-salt materials as discussed elsewhere herein) and the vertical element areas 804 comprise an n-type material (e.g. element area 416 and/or any n-type material as discussed elsewhere herein). P-n junctions form at the interfaces between the vertical element areas 804 and the adjacent zones of the p-type Pb-salt layer 802, for example, as shown in FIG. 6. Alternatively, the Pb-salt layer 802 may comprise an n-type material, wherein the vertical element areas 804 correspondingly comprise a p-type material. The conducting layer 812 may comprise a transparent conducting oxide (TCO) film, such as, but not limited to indium tin oxide (tin-doped indium oxide), fluorine doped tin oxide, carbon nanotube networks, graphene, polymers such as poly (3,4-ethylenedioxy thiophene) (PEDOT), and derivatives thereof, copolymers such as PEDOT:PSS (polystyrene sulfonate), aluminum doped zinc oxide (AZO), and indium-doped cadmium oxide. The substrate 814 may be constructed of, but is not limited to, any suitable substrate material described elsewhere herein.

Figure 9:
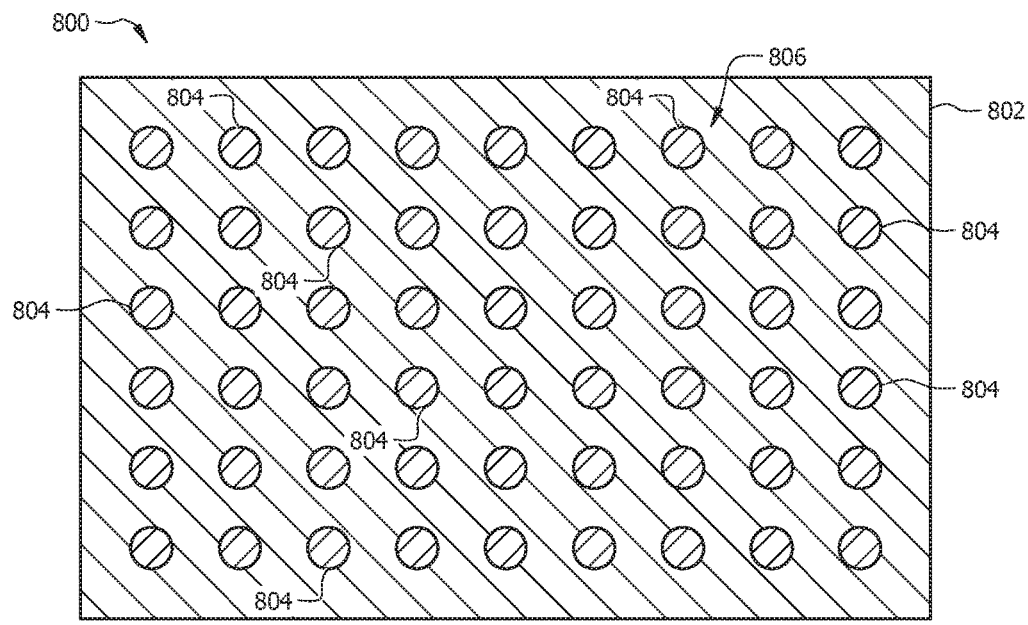
FIG. 9 is a cross-sectional view, taken along line 9-9 in FIG. 8, of the PV Pb-salt detector of FIG. 8.

FIG. 9 is a cross-sectional view taken through line 9-9 of the PV Pb-salt detector 800. As shown in FIG. 9, each of the vertical element areas 804 are spaced apart from each other such that the Pb-salt layer 802 surrounds each of the element areas 804. The vertical element areas 804 may be constructed to have a cylindrical-like shape or any other suitable rod-like or stump-like shape. Design criteria of the PV Pb-salt detector 800 of the presently disclosed inventive concepts include, but are not limited to optimization of the distance between p- and n-region based on the carrier lifetime. In principle, photo-induced electrons and holes should be spatially separated by the p-n junction. At the same time, the distances apart should not be too small to avoid "sweep-out" effect. These dimensions can be designed based on the material parameters such as dielectric constant and doping concentration. For example, for PbSe, the distance can be in a range of about 0.5 µm to about 5 µm. In other embodiments, the Pb-salt distance may range from about 10 nm to about one millimeter.

Figure 10:
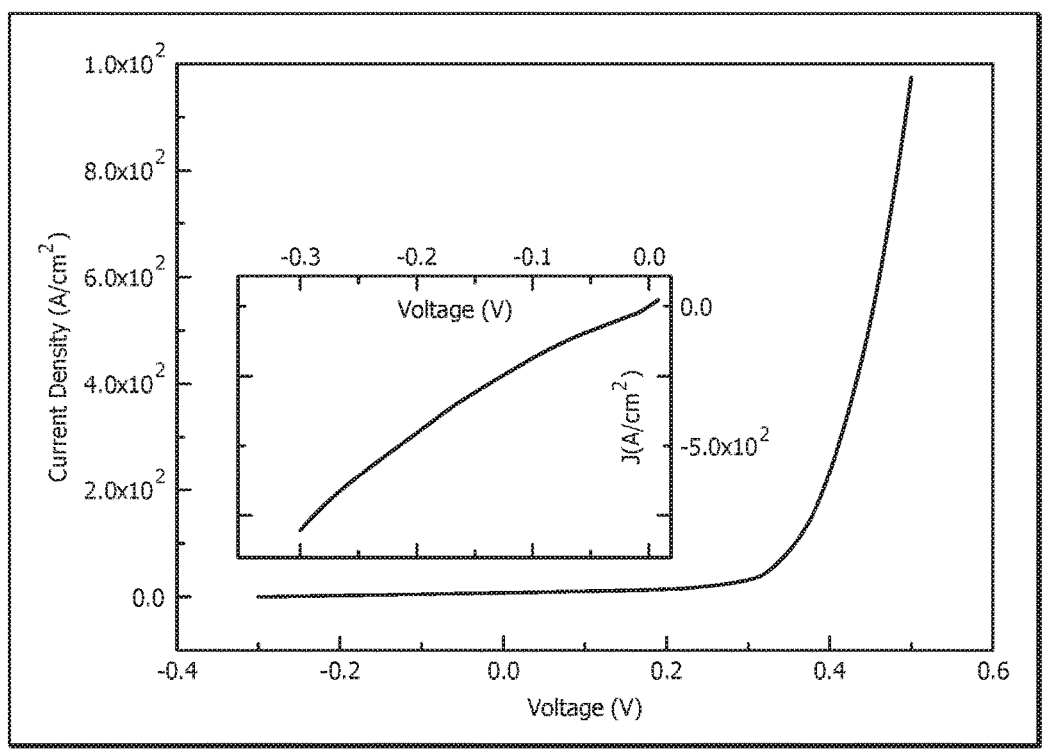
FIG. 10 illustrates an I-V curve for a PV Pb-salt detector that comprises a plurality of three-dimensional CSJs.

FIG. 10 illustrates a J-V curve for the PV Pb-salt detector 800 depicted in FIG. 8. Detectivities of the PV Pb-salt detector 800 (e.g., wherein the Pb-salt is PbSe), may be in the range (at room temperature) of about $1 \times 10^{10}$ cmHz$^{1/2}$ W$^{-1}$ to about $1 \times 10^{11}$ cmHz$^{1/2}$ W$^{-1}$. The detectivities may output perform typical currently available photoconductive (PC) detectors. Further, the response times of the PV Pb-salt detector 800 may generally be in the range of about 100 ns to about 600 ns, which may be faster than typical PC detector counterparts (which is generally about several µs).

In one non-limiting embodiment, the fabrication process for a CSJ detector of the presently disclosed devices starts with an MBE growth of a p-type Pb-salt layer (such as, but not limited to PbSe or PbSnSe or other suitable IV-VI materials described herein) on a substrate material, such as a Si substrate. Photolithography, the deposition of SiO$_2$, and the lift-off may be used to form a SiO$_2$ mask (grid) on the p-type layer. A second MBE growth of an n-type doping layer on areas of the p-type layer not covered by the SiO$_2$ mask (n-type dopant could comprise n-type doped Pb-salt materials, thermal deposition of n-type dopants, or a simple Schottky contact, or other materials described herein). Afterwards, etching may be used to remove most of the SiO$_2$ mask layer to expose p-type grid pattern with interleaved n-type grid pattern. Annealing may be used for impurity diffusion followed by O$_2$ passivation. Ohmic contact formation may subsequently occur on exposed n-type and p-type grid elements.

Figure 11:
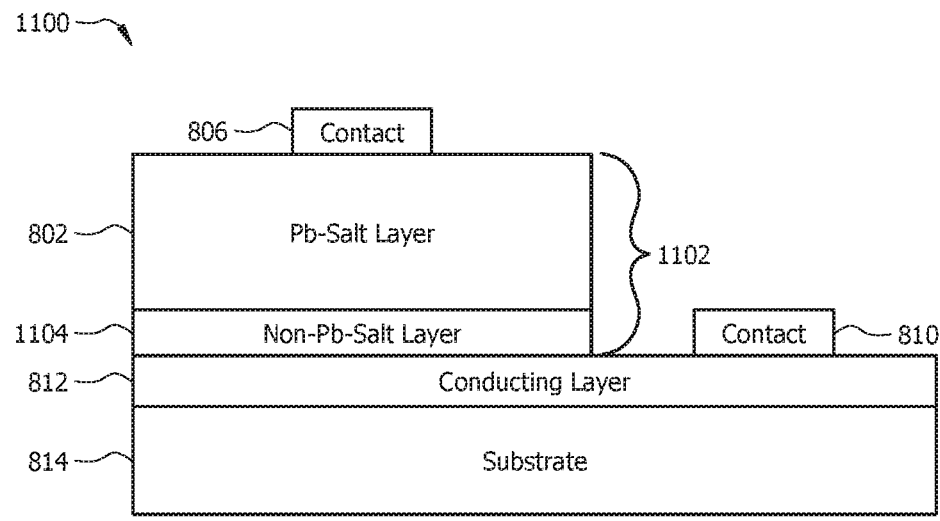
FIG. 11 is a schematic diagram of a non-limiting embodiment of a PV Pb-salt detector that comprises a heterojunction.

FIG. 11 is a schematic diagram of another non-limiting embodiment of a PV Pb-salt detector of the present disclosure, designated by the general reference numeral 1100 and which comprises a heterojunction region 1102, which may comprise at least one Pb-salt layer 802 and at least one non-Pb-salt layer 1104. The non-Pb-salt layer 1104 may be disposed on a conducting layer 812 (as discussed above), and the conducting layer 812 may be disposed on substrate 814 (as discussed above). The Pb-salt layer 802 may be a p-type material (e.g. more holes concentration) and the non-Pb-salt layer 1104 may be an n-type material (e.g. more electrons concentration). Alternatively, the Pb-salt layer 802 may be an n-type material and the non-Pb-salt layer 1104 may be a p-type material. The band gaps for the Pb-salt layer 802 and the non-Pb-salt layer 1104 may be type II band gaps as shown in FIG. 1 or 2. As noted above, where used herein, the term "non-Pb-salt" layer or material refers to a material comprising, in at least certain embodiments, CdSe$_{1-x}$S$_x$ or Cd$_x$Zn$_{1-x}$Se$_y$S$_{1-y}$, wherein $0 \leq x \leq 1$ and $0 \leq y \leq 1$, ZnO, and oxides such as TiO$_2$.

In at least one non-limiting embodiment as shown in FIG. 11, the heterojunction region 1102 may comprise a Pb-salt layer (e.g., PbSe) 802 that is coupled to and deposited upon a non-Pb-salt layer 1104. In other words, when fabricating the p-n junction, the Pb-salt layer 802 may be grown upon the non-Pb-salt layer 1104. The PV Pb-salt detector 1100 comprises one or more n-type non-Pb-salt layer 1104 and one or more p-type Pb-salt layer 802.

Figure 12:
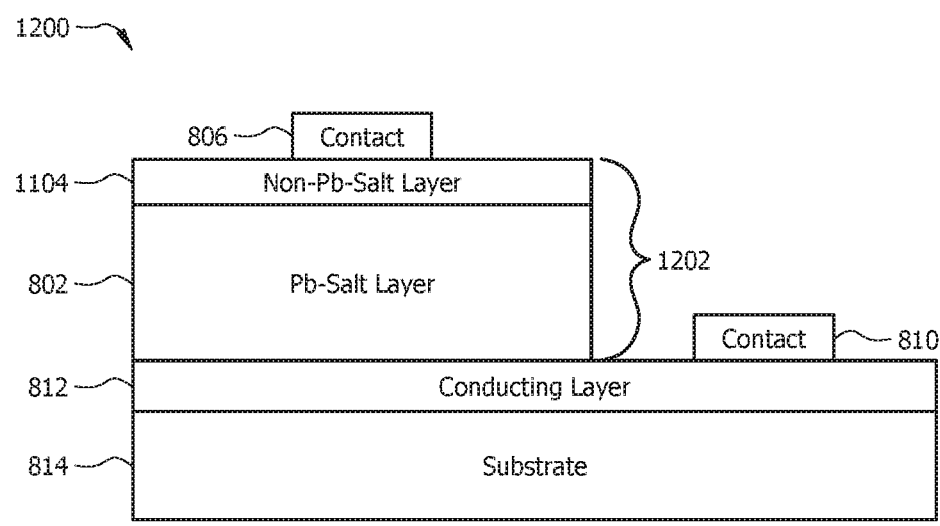
FIG. 12 is a schematic diagram of an embodiment of a PV Pb-salt detector with the Pb-salt layer grown prior to the non-Pb-salt layer.

In contrast, FIG. 12 is a schematic diagram of an alternate embodiment of a PV Pb-salt detector 1200 having the Pb-salt layer 802 grown prior to the non-Pb-salt layer 1104. For example, the p-n junction could be formed by growing a non-Pb-salt layer 1104 on top of the Pb-salt layer 802. Any growing method known by persons of ordinary skill in the art may be used to grow the Pb-salt layer 802 on top of the non-Pb-salt layer 1104 and/or grow the non-Pb-salt layer 1104 on top of the Pb-salt layer 802. In one non-limiting embodiment, the conducting layer 812 may comprise substantially the same material as the Pb-salt layer 802. The Pb-salt layer 802 may comprise a p-type material and the non-Pb-salt layer 1104 may comprise an n-type material.

In certain non-limiting embodiments, the Pb-salt layers of the PV Pb-salt detectors 400, 500, 600, 800, 1100, and 1200 or any other detector embodiment described herein, the Pb-salt layer may be selected from the group consisting of Pb$_y$X$_{1-x}$Se$_y$Te$_{1-y}$, Pb$_y$X$_{1-x}$Se$_y$S$_{1-y}$, and Pb$_y$X$_{1-x}$Te$_y$S$_{1-y}$, wherein X is Sn, Sr, Eu, Ge, or Cd, (i.e., other group IIA, IIB, IVA, or lanthanide elements, or any other chemical element, configured to form ternary or quaternary compound semiconductors), and wherein $0 \leq x \leq 1$, and $0 \leq y \leq 1$. For example, the Pb-salt layer may comprise ternary compounds such as, but not limited to, PbSnSe, PbSnTe, PbSrSe, PbSrTe, PbEuSe, PbEuTe, PbCdSe, and PbCdTe, or quaternary compounds, such as, but not limited to, PbSnSeTe, PbSnSeS, and PbSnTeS. The Pb-salt layer could be in mono-crystalline, polycrystalline or amorphous form. As noted above, the Pb-salt layer could also be in bulk form, microcrystalline form, or nano-structures such as quantum dots, quantum wire or quantum well. The Pb-salt layer could be in two-dimensional form or three-dimensional form, such as a "forest" of wires.

In certain embodiments, the Pb-salt or non-Pb-salt layers described herein comprise a two-dimensional layer, or three-dimensional elements embedded within another layer, such as the PV detector 800 as described in FIGS. 8 and 9. The substrate upon which the layers are disposed could be any suitable material, such as, but not limited to Si (e.g., mono-crystalline silicon), silica, $SiO_2$, glass, $BaF_2$, quartz, sapphire, and conductive transparent oxides e.g., F-doped tin oxide, or Indium tin oxide. In one non-limiting embodiment, the conductive film may be a Pb-salt mono-crystalline material. Certain non-Pb-salt materials, such as but not limited to $CdSe_{1-x}S_x$, can be grown on different surfaces including metals, thus could be grown directly on a readout circuit. Afterward, the Pb-salt arrays could then be grown on the non-Pb-salt layer (e.g, $CdSe_{1-x}S_x$). The chemical growth method for growing the non-Pb-salt layer and the Pb-salt arrays may be scaled up to fabricate relatively large format arrays.

More particularly, CdS is a wide band gap semiconductor material with energy gap ($E_g$) at about 2.4 electron volts (eV) and may be an n-type and window material with relatively high efficiency thin film solar cells based on CdTe, and Copper Indium Gallium Selenide ("CIGS"), and other optoelectronic devices. The electron affinities of CdS and CdSe are around 4.5 eV and 4.0 eV, respectively, which are relatively close to PbSe material. The $CdSe_{1-x}S_x$ can form a heterojunction with various Pb-salt materials such as PbSe shown in FIG. 3 for IR photodiode detector fabrication. In the following chemical growth method, an epitaxial PbSe thin film is used to demonstrate the feasibility of n-CdS/p-PbSe heterostructure (e.g., where CdS has a larger band gap energy than PbSe) for mid-IR detector applications. The chemical growth method (e.g. fabrication) for both Pb-salt materials and CdS as well as the form of materials (monocrystalline, polycrystalline, amorphous); however, is not limited to the specific fabrication method or material form.

In one non-limiting example of the fabrication of a PV Pb-salt detector, for example as described in FIG. 12, two consecutive material growth steps may be used in the chemical growth method to form the Pb-salt layer and the n-non-Pb-salt layer. In one non-limiting embodiment, the growth method may be performed in a two-growth-chamber MBE system. The first material growth step may involve PbSe thin film growth or any other Pb-salt material. A double polished high resistant Si wafer (~3500 Ω·cm) (or any other suitable substrate described herein) may be cleaned, such as a modified Shiraki cleaning method known by persons skilled in the art, prior to the growth. After cleaning, the Si wafer may be dried with a high purity nitrogen gas ($N_2$) purge and transferred into the MBE system. In order to obtain a high quality PbSe thin film on Si wafer, a buffer layer, such as an ultrathin $CaF_2$ (~2 nm), may be grown in the first growth chamber, to compensate for the lattice and thermal mismatch between PbSe and Si. Other materials may be used as the buffer layer if the other materials are substantially similar to the lattice of Si and have a thermal expansion coefficient that is substantially similar to the Pb-salt material. The substrate temperature during growth of the Pb-salt layer may be controlled at about 800° C. in order to obtain surface reconstruction of Si substrate for epitaxial growth of calcium fluoride ($CaF_2$). After formation of the buffer layer, the Pb-salt film (e.g. about 1.2 μm in thickness) may then be deposited in the second growth chamber of the MBE system. Substrate temperature may be about 390° C. for Pb-salt layer growth with a Pb-salt deposition rate of about 25 nm/minute. For example, an additional Se source may be used to adjust the p-type carrier concentration of the film and also to control material quality because of the high Se vapor pressure during growth.

The second material growth step may grow a non-Pb-salt film on top of the Pb-salt film by using a CBD method. Prior to the CBD, the Pb-salt film on Si substrate (or other suitable substrate) may be divided into one or more relatively smaller samples. The relatively smaller samples may be fixed on a Teflon® holder and kept vertically in the CBD solution during growth. The chemicals used in the CBD solution may comprise analytic grade reagents without further purification. In one non-limiting embodiment, a 15 milliliter (ml) mixed aqueous solution that comprises Cadmium Acetate ($Cd(CH_3COO)_2$) (e.g. 24 millimoles (mmol)) and Ammonium Acetate ($NH_4CH_3COO$) (e.g., 24 mmol) may be used as a Cd precursor, and a 15 ml thiourea (e.g. 30 mmol) may be used as a sulfur precursor. The two solutions may be mixed together in another 60 ml glass bottle and 7.5 ml $NH_3.H_2O$ may be introduced into the bottle as a complexing agent. The Pb-salt samples in the Teflon holder are immersed in the aqueous solution, and the bottle may then be heated up and stabilized for about an hour in the 60° C. water bath for subsequent non-Pb-salt film deposition (thickness is about 100 nm). After the growth, the as-grown non-Pb-salt/Pb-salt samples may be rinsed in deionized water and may then be purged to dry out under high purity $N_2$.

The carrier concentrations of non-Pb-salt and Pb-salt thin films prepared using the CBD as described above may be about n~$1\times10^{16}$ $cm^{-3}$ and p~$3\times10^{17}$ $cm^{-3}$, respectively. The electron concentration of the non-Pb-salt may be about one order of magnitude lower than the hole concentration of Pb-salt at room temperature, which means that major depletion region may fall on the non-Pb-salt side. Therefore, for the non-Pb-salt/Pb-salt mid-IR detector structure, almost or all of the photon-generated carriers in Pb-salt layers have been collected through diffusion mechanism rather than quick drift process in the depletion region. Typically, the minority carrier lifetime in p-type Pb-salt grown on Si (111) is ~1 ns. Since the mobility measured through Hall effect is 500 $cm^2 \cdot V^{-1} \cdot s^{-1}$ at room temperature, the diffusion length is calculated to be 0.928 μm from the equation $L_e=\sqrt{\mu k_B T \tau/q}$, in which $L_e$ means the diffusion length, μ stands for the electron mobility, $k_B$ is the Boltzmann constant, T is the absolute temperature, T means the minority carrier lifetime, and q is the electron charge. Therefore, even most of the depletion region is in the non-Pb-salt layer, the photo-generated carriers are sufficiently collected since the diffusion length may be relatively close to the thickness of Pb-salt film.

After growing the non-Pb-salt and Pb-salt layers, the photovoltaic detectors may be fabricated using a photolithographic patterning using AZ 2400 positive photoresist and MJB3 mask aligner. Etching may be performed using diluted hydrogen chloride (HCl) etchant solution (HCl:$H_2O$=1:9). The junction area may be formed using similar photolithographic technology and thermal vapor deposition of gold (Au) contacts for both non-Pb-salt and Pb-salt layers. Other conductive materials may be used besides Au when forming the contacts for both the non-Pb-salt and Pb-salt layers. The lift-off procedure may be performed after the metal deposition.

Figure 13:
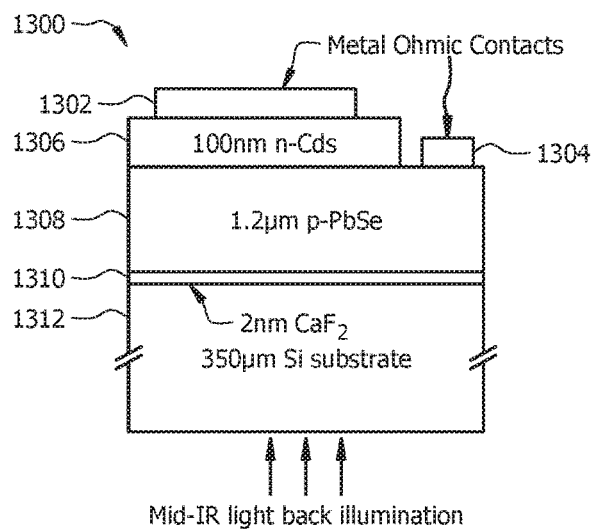
FIG. 13 is a schematic diagram of a non-limiting embodiment of a PV Cadmium-Sulfur (CdS)/Pb-Selenide (Se) (PbSe) heterojunction detector.

In one non-limiting embodiment, FIG. 13 depicts a schematic diagram of a PV non-Pb-salt/Pb-salt heterojunction detector 1300, wherein the non-Pb-salt is CdS and the Pb-salt is PbSe. The PV CdS/PbSe heterojunction detector 1300 may comprise a Si substrate 1312, a $CaF_2$ conducting layer 1310, a p-type PbSe layer 1308, and an n-type CdS layer 1306. An n-type Ohmic contact 1302 may contact the n-type CdS layer 1306 and a p-type Ohmic contact 1304 may contact the p-type PbSe layer 1308. As shown in FIG. 13, the Si substrate 1312 may have a thickness of about 350 µm, the CaF$_2$ conducting layer 1310 may have a thickness of about 2 nm, the p-type PbSe layer 1308 may have a thickness of about 1.2 µm, and the n-type CdS layer 1306 may have a thickness of about 100 nm.

The quantum efficiency of the PV CdS/PbSe heterojunction detector 1300 determines the response intensity behavior of the detector with the temperature. There are two regions in p-type PbSe layer 1308 that produce photo-generated carriers, including neutral p-type region and junction region on p-type PbSe layer 1308 side. In the back illumination case, the incident light intensity decays exponentially in the p-type PbSe layer 1308 (about 1.2 µm), and thus most of photo-generated carriers are in neutral p-type PbSe region. On the other hand, as mentioned previously, due to carrier concentration difference, most of the depletion region drops in n-type CdS layer 1306. The calculated depletion width in PbSe side at room temperature is about ~2.7 nm. Although depletion width may change with temperature, it is relatively small compared to the p-type PbSe layer 1308 thickness. The carrier collection efficiency affected by bias condition may not be a factor to be considered because of the zero bias photovoltaic mode operation method. As a result, photo-generated carriers in neutral p-type PbSe region dominate the photodetector quantum efficiency, which can be described as follows, assuming there is no potential barrier for minority carrier transport due to heterojunction band offset as shown in equation 1:

$$\eta_P = \frac{(1-r)\alpha L_e}{\alpha^2 L_e^2 - 1}\left\{\frac{\alpha L_e - e^{-\alpha x_p}sh(x_p/L_e)}{ch(x_p/L_e)} - \alpha L_e e^{-\alpha x_p}\right\} \quad \text{(eqn. 1)}$$

The variable r is the illuminated junction surface reflection coefficient, α is the absorption coefficient, $L_e$ is the electron diffusion length as mentioned, and $x_p$ is the distance from backside of PbSe film to the p side junction boundary. The temperature dependent parameters including diffusion length $L_e$ and absorption coefficient α play may affect the quantum efficiency and eventually photoresponse. As stated above, diffusion length $L_e=\sqrt{\mu k_B T \tau/q}$. Carrier mobility in lead-salt semiconductor is proportionally to $T^{-5/2}$ mainly due to the decrease of phonon scattering.

Figure 15:
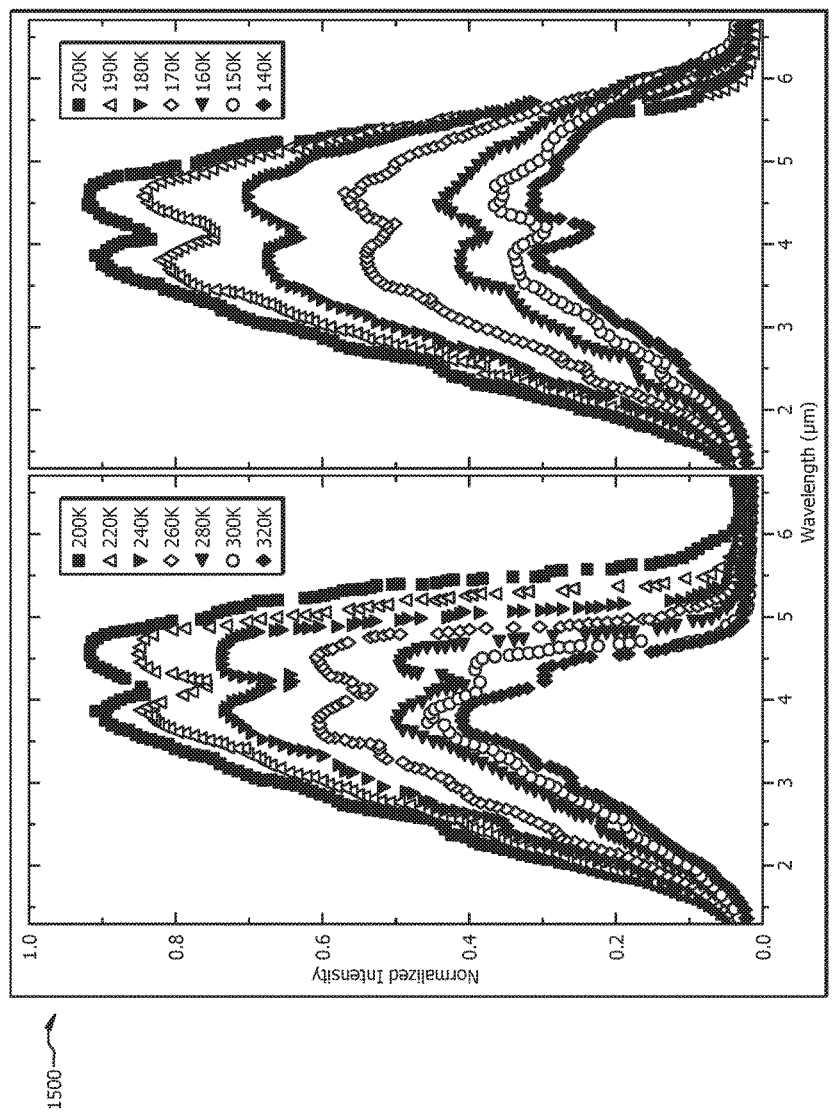
FIG. 15 illustrates a temperature-dependent mid-IR spectrum-resolved photoresponses of the CdS/PbSe heterojunction detector depicted in FIG. 13.

Conversely, the minority carrier lifetime, especially at lower temperatures, in the p-type PbSe layer 1308 may be dominated by the Shockley-Read-Hall recombination process, which is not substantially affected by temperature. Therefore, the diffusion length increases at lower temperature. Not only are the absorption edge red-shifts to longer wavelength, but also the absorption coefficient increases slightly in the photoresponse spectral range at lower temperature. Therefore, temperature-dependent quantum efficiency can be estimated by using the discussed diffusion length and absorption parameters. The simulation based on the theory described above shows that quantum efficiency increases from about 20% to about 70% while temperature drops from room temperature down to about 140 K. As a result, the photoresponse intensity may typically increase at lower temperature, which is shown in FIG. 15.

Figure 14:
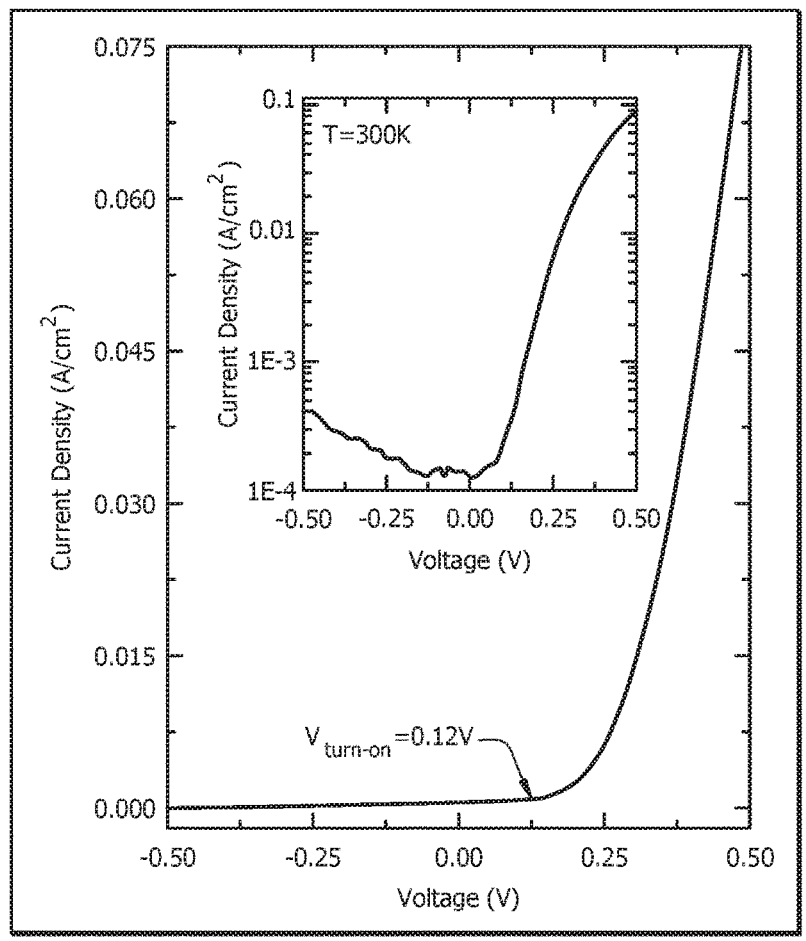
FIG. 14 illustrates a J-V curve for the PV CdS/PbSe heterojunction detector depicted in FIG. 13.

FIG. 14 illustrates a current density/voltage (J-V) curve for the PV CdS/PbSe heterojunction detector 1300 of FIG. 13. FIG. 14 illustrates the room temperature joules-volts (J-V) characteristic of an n-type CdS/p-type PbSe heterojunction detector 1300. By applying both a reverse and a forward bias from −0.5 to 0.5 V, the heterojunction acts as a diode according to the rectifying current flow through the junction as shown in FIG. 14. The rectifying ratio measured at about ±0.3 V is about 178. The dark current density is about 1.15×10$^{-4}$ A/cm$^2$ at about 10 milli-V (mV) and a forward turn-on voltage is about 0.12 V. The forward J-V characteristic of a p-n junction may be described by the exponential relation J∝exp(qV/ηk$_B$T), where η is the ideality factor, when exp(qV/ηk$_B$T)>>1. Using the data from about 0.15 V to 0.25 V, the ideality factor η is determined by curve fitting to be about 1.79, which indicates the recombination current may play a major role in this range. The inset box in FIG. 14 shows a curve which is the same J-V characteristic but wherein the current density is in logarithm.

The PV CdS/PbSe heterojunction detector 1300 performance may be evaluated by a detectivity measurement system. For example, a calibrated 800 Kelvin (K) blackbody from Infrared System Development may be used as the standard infrared light source. A Thorlabs mechanical chopper is integrated in order to provide a frequency-modulated heat source. PV mode may be used, which means zero bias is applied on the heterojunction diode during the measurement. Without connecting to any preamplifier, signal and noise currents from the device are directly collected by a Stanford Research System SR830 lock-in amplifier. The responsivity R and specific detectivity D* are obtained by using the definition as shown below in equation 2:

$$\begin{cases} D^* = R \times \dfrac{\sqrt{A \times \Delta f}}{I_n} & (\text{cm} \cdot \text{Hz}^{1/2}/W) \\ R = \dfrac{I_s}{P_i} & (A/W) \end{cases} \quad \text{(eqn. 2)}$$

The variables $I_s$ and $I_n$ are the measured detector output signal and noise currents, A is the device detection area, Δf is the noise bandwidth, and $P_i$ is the incident radiant power. Peak responsivity $R_{peak}$ and Peak detectivity $D^*_{peak}$ are then calculated. Under 700 Hz chopping frequency modulation, the detector demonstrates $R_{peak}$ of 0.055 A/W and $D^*_{peak}$ of 5.482×10$^8$ cm·Hz$^{1/2}$/W at λ=4.7 µm at 300K under PV mode. Table I shown below summarizes measurement conditions and results.

TABLE I

Performance characterizations of the CdS/PbSe photovoltaic detectors

| Detection Area (µm$^2$) | T (K) | $I_s$ (pA) | $I_n$ (pA) | R at λ$_c$ (A/W) | D* (λ$_c$, 700, 1 Hz) (cmHz$^{1/2}$/W) |
|---|---|---|---|---|---|
| 200 × 200 | 300 | 500 | 2.0 | 0.055 | 5.482 × 10$^8$ |

(Note: λ$_c$ is about 4.7 µm, and measurement is at PV mode (zero voltage))

Figure 16:
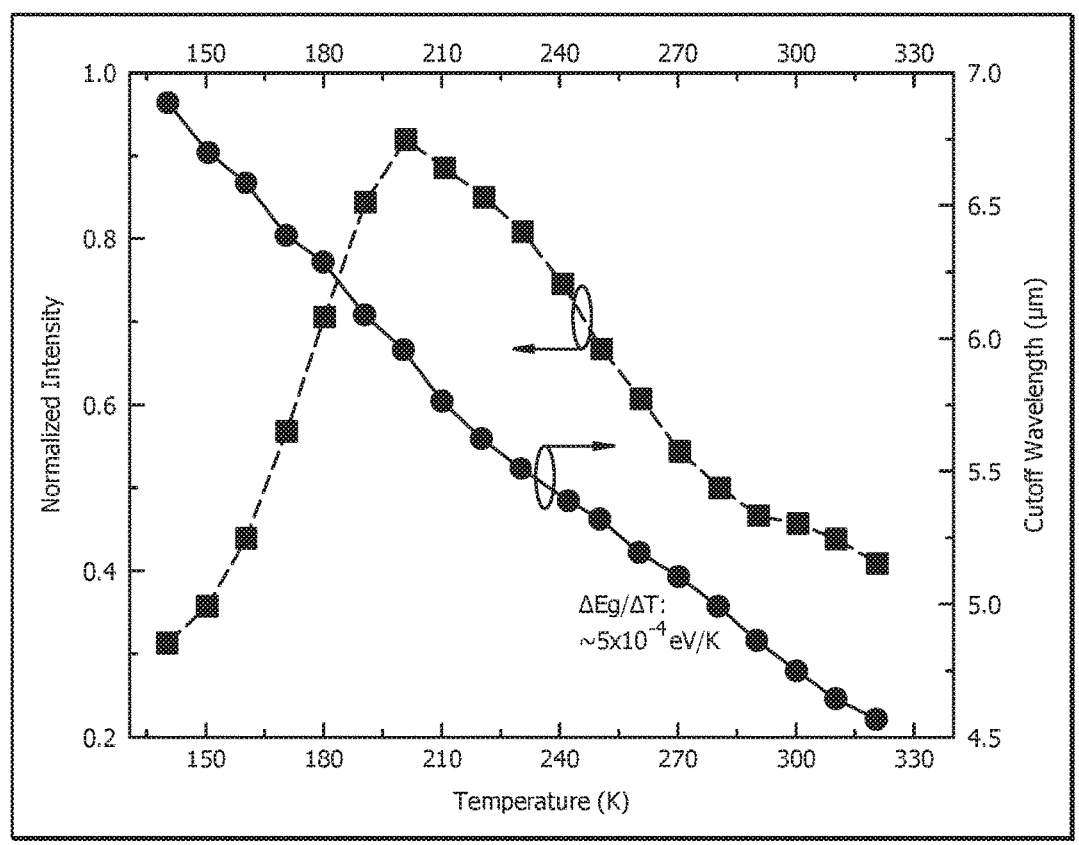
FIG. 16 illustrates the peak photoresponse intensities and the cutoff wavelengths versus the temperatures of the CdS/PbSe heterojunction detector depicted in FIG. 13.

The cutoff wavelength is obtained from the spectral response measurement described as follows. FIG. 15 illustrates temperature-dependent mid-IR spectrum-resolved photoresponses of the CdS/PbSe heterojunction detector 1300 from 320 K to 200 K and from 200K to 140 K. The measurements are taken by a Bruker IFS-66v Fourier Transform Infrared Spectroscope system. As seen in FIG. 15, when temperature decreases from 320 K to 200 K, both photoresponse and the cutoff wavelength increase gradually. After the temperature drops below 200 K, the cutoff wavelength is still increasing with the decreasing temperature, but the peak photoresponse intensity decreases as illustrated. FIG. 16 illustrates normalized peak photoresponse intensities and the cutoff wavelengths at temperatures ranging from 140K to 320 K. In FIG. 16, the maximum photoresponse intensity is obtained at around 200 K.

As noted above, examples of Pb-salts which can be used in the PV Pb-salt detectors throughout the present disclosure include, but are not limited to combinations of Group IV and Group VI elements, such as $Pb_xX_{1-x}Se_yTe_{1-y}$, $Pb_xX_{1-x}Se_yS_{1-y}$, and $Pb_xX_{1-x}Te_yS_{1-y}$, wherein X is Sn, Sr, Eu, Ge, or Cd, and wherein $0 \leq x \leq 1$, and $0 \leq y \leq 1$, including but not limited to, PbS, PbSe, PbTe, PbSnSe, PbSnTe, PbSrSe, PbSrTe, PbEuSe, PbEuTe, PbCdSe, PbCdTe, and any Pb-salt containing a combination of two, three, four, or more Group IV and Group VI elements. Substrates that may be used in the devices of the presently disclosed inventive concepts include, but are not limited to silicon, glass, silica, quartz, sapphire, $CaF_2$, and other substrates commonly used by persons having ordinary skill in the art to construct photodetectors. Examples of p-type and n-type doping materials which can be used in the presently disclosed detectors include, but are not limited to: Se, Tl, $BaF_2$, Na, Pb, Bi, Sb, In, and I.

The presently disclosed detectors may be implemented for mid-/far IR sensing and imaging applications. The PV Pb-salt photodetectors enable a relatively low-cost, relatively large-format detector focal plane array having high detectivity at ambient temperatures. Examples of the utilities of the PV Pb-salt detectors and FPAs of the present disclosure include, but are not limited to thermal imaging and environmental uses (e.g. gas detection and control, and pollution measurements).

In certain embodiments, the present disclosure is directed to an infrared (IR) photovoltaic (PV) detector, comprising: a IV-VI Lead (Pb)-salt layer disposed on a substrate; and a charge-separation-junction (CSJ) structure, wherein the CSJ structure comprises a plurality of element areas disposed upon or within the IV-VI Pb-salt layer, wherein the plurality of element areas are positioned to form a plurality of spaced apart junctions, wherein each element area is connected to a first Ohmic contact thereby forming a plurality of interconnected first Ohmic contacts, and wherein a second Ohmic contact is disposed upon or is in contact with a portion of the IV-VI Pb-salt layer. Each element area may comprise a dopant diffusion region in the IV-VI Pb-salt layer adjacent the corresponding element area forming a plurality of spaced apart p-n junctions in the IV-VI Pb-salt layer. The IV-VI Pb-salt layer may comprise a p-type material, and the CSJ structure may comprise an n-type material, or the IV-VI Pb-salt layer may comprise an n-type material, and the CSJ structure may comprise a p-type material. The second Ohmic contact may be disposed upon or in contact with the portion of the IV-VI Pb-salt layer comprising a plurality of p-type Ohmic contacts positioned between each element area thereby forming a plurality of interconnected p-type Ohmic contacts. The plurality of spaced apart junctions may comprise Schottky contact junctions. The IV-VI Pb-salt layer may comprise a compound selected from a group consisting of $Pb_xX_{1-x}Se_yTe_{1-y}$, $Pb_xX_{1-x}Se_yS_{1-y}$, and $Pb_xX_{1-x}Te_yS_{1-y}$, wherein X is Sn, Sr, Eu, Ge, or Cd, and wherein $0 \leq x \leq 1$, and $0 \leq y \leq 1$. The IV-VI Pb-salt layer may be a single layer on the substrate. The CSJ structure may be two-dimensional or three-dimensional. The IV-VI Pb-salt layer may have an absorption wavelength that falls within a range of about 0.5 micrometers (μm) to about 32 μm. The IV-VI Pb-salt layer may have a mono-crystalline, polycrystalline, or amorphous. The element areas may comprise at least one of strips, wires, tubes, rods, stumps, and dots. The element areas may be substantially parallel to each other. The element areas may be positioned substantially perpendicular to the substrate or may be positioned substantially parallel to the substrate. The substrate may have a planar shape or a non-planar shape. One or more of the IR PV detectors may be disposed upon an array substrate to form a focal plane array.

In certain embodiments, the present disclosure is directed to a photovoltaic (PV) detector, comprising: a heterojunction region that comprises at least one IV-VI Lead (Pb)-salt layer coupled to at least one non-Pb-salt layer, wherein the at least one IV-VI Pb-salt layer and the at least one non-Pb-salt layer form a p-type-n-type (p-n) junction with a type II band gap alignment, and wherein the type II band gap alignment is arranged such that a conduction band of an n-type material of the p-n junction has an energy level that is about equal to or is less than an energy level of a conduction band of a p-type material of the p-n junction. The heterojunction region may detect wavelengths of light within an IV-VI Pb-salt absorption range. The IV-VI Pb-salt absorption range may fall within a range of about 0.5 micrometers (μm) to about 32 μm. The IV-VI Pb-salt layer may comprise a compound selected from a group consisting of $Pb_xX_{1-x}Se_yTe_{1-y}$, $Pb_xX_{1-x}Se_yS_{1-y}$, and $Pb_xX_{1-x}Te_yS_{1-y}$, wherein X is Sn, Sr, Eu, Ge, or Cd, and wherein $0 \leq x \leq 1$, and $0 \leq y \leq 1$. The non-Pb-salt layer may comprise the n-type material of the p-n junction and the Pb-salt layer may comprise the p-type material of the p-n junction. The non-Pb-salt layer may comprise the p-type material of the p-n junction and the Pb-salt layer may comprise the n-type material of the p-n junction. The non-Pb-salt layer may be selected from a group consisting of $CdSe_{1-x}S_x$, $Cd_xZn_{1-x}Se_yS_{1-y}$, ZnO, and $TiO_2$ wherein $0 \leq x \leq 1$, and $0 \leq y \leq 1$. The non-Pb-salt layer may be constructed of a material that forms a type II band alignment that is suitable for PV detector fabrication. The readout circuit may be directly disposed on the non-Pb-salt layer. The IV-VI Pb salt layer may be selected from the group consisting of polycrystalline materials and monocrystalline materials. The IV-VI Pb-salt layer may be disposed above the non-Pb-salt layer. The IV-VI Pb-salt layer may be disposed below the non-Pb-salt layer. The non-Pb-salt layer may be selected from a group consisting of a group II-VI material or an oxide material. One or more of the PV detectors may be disposed upon an array substrate to form a focal plane array.

In certain embodiments, the present disclosure is directed to a detector for detecting infrared light, comprising: a IV-VI Lead (Pb)-salt layer disposed on a substrate; a plurality of junction layers applied to an upper surface of the IV-VI Pb-salt layer to form a plurality of junctions comprising either p-n junctions or Schottky contact junctions; one or more junction electrical contacts that are interconnected with each other and applied to an upper surface of the plurality of junction layers; one or more Pb-salt electrical contacts that are interconnected with each other and applied to a portion of the IV-VI Pb-salt layer; wherein upon illumination of the junctions a photoelectric current is generated and absorbed by IV-VI Pb-salt layer, whereby the one or more junction electrical contacts and the one or more Pb-salt electrical contacts collect a plurality of free electrons and a plurality of free holes. The plurality of junctions may be p-n junctions configured with a type II band alignment such that a conduction band of an n-type material of the p-n junctions is about equal to or at a lower energy level than a conduction band of a p-type material of the p-n junctions.

The p-n junctions or the Schottky contact junctions may be configured to detect wavelengths of light within a IV-VI Pb-salt absorption range. The IV-VI Pb-salt absorption range may fall within a range of about 0.5 μm to about 32 μm. The IV-VI Pb-salt layer may be a polycrystalline material deposited in a microcrystalline form or as a nano-structure. The IV-VI Pb-salt layer may comprise a compound selected from a group consisting of $Pb_xX_{1-x}Se_yTe_{1-y}$, $Pb_xX_{1-x}Se_yS_{1-y}$, and $Pb_xX_{1-x}Te_yS_{1-y}$, wherein X is Sn, Sr, Eu, Ge, or Cd, and wherein $0 \le x \le 1$, and $0 \le y \le 1$. The plurality of junction layers may comprise a non-Pb-salt layer that forms a plurality of heterojunctions. The plurality of junction layers may comprise a non-Pb-salt layer that forms the Schottky contact junctions. The plurality of junction layers may comprise substantially the same material as the IV-VI Pb-salt layer to form a plurality of homojunctions. The IV-VI Pb-salt layer may comprise a p-type material and the plurality of junction layers may comprise an n-type material. The IV-VI Pb-salt layer may comprise an n-type material and the plurality of junction layers may comprise a p-type material. The one or more Pb-salt electrical contacts disposed upon a portion of the IV-VI Pb-salt layer may be positioned between each of the junction layers. The junction layers may be positioned substantially parallel to the substrate. The junction layers may be positioned substantially perpendicular to the substrate. The non-Pb-salt layer may be selected from a group consisting of $CdSe_{1-x}S_x$, $Cd_xZn_{1-x}Se_yS_{1-y}$, ZnO, and $TiO_2$, wherein $0 \le x \le 1$, and $0 \le y \le 1$. The non-Pb-salt layer may be constructed of a material that forms a type II band alignment that is suitable for PV detector fabrication. The non-Pb-salt layer may be selected from a group consisting of a group IIB-VI material or an oxide material. One or more of the PV detectors may be disposed upon an array substrate to form a focal plane array.

All of the compositions, devices, and/or methods disclosed herein can be made and executed without undue experimentation in light of the present disclosure. While the compositions, devices and methods of the present disclosure have been described in terms of particular examples and embodiments, it will be apparent to those of skill in the art that variations may be applied to the devices, compositions and/or methods and in the steps or in the sequence of steps of the method described herein without departing from the concept, spirit and scope of the present disclosure. All such similar substitutes and modifications apparent to those skilled in the art are deemed to be within the spirit, scope and concept of the inventive concepts as defined by the appended claims. Moreover, the following claims are exemplary claims supported by the present disclosure and are not intended to be limiting of the claims which can be pursued in subsequent patent applications based on the present application.

What is claimed is:

1. A photovoltaic (PV) detector comprising:
a heterojunction region that comprises at least one IV-VI Lead (Pb)-salt layer coupled to at least one non-Pb-salt layer,
wherein the at least one IV-VI Pb-salt layer and the at least one non-Pb-salt layer form a p-type-n-type (p-n) junction with a type II band gap alignment, and
wherein the type II band gap alignment is arranged such that a first conduction band of an n-type material of the p-n junction has an energy level that is about equal to or is less than an energy level of a second conduction band of a p-type material of the p-n junction.

2. The PV detector of claim 1, wherein the heterojunction region is configured to detect wavelengths of light within a IV-VI Pb-salt absorption range.

3. The PV detector of claim 2, wherein the IV-VI Pb-salt absorption range falls within a range of about 0.5 micrometers (μm) to about 32 μm.

4. The PV detector of claim 1, wherein the IV-VI Pb-salt layer comprises a compound selected from a group consisting of $Pb_xX_{1-x}Se_yTe_{1-y}$, $Pb_xX_{1-x}Se_yS_{1-y}$, and $Pb_xX_{1-x}Te_yS_{1-y}$, wherein X is Sn, Sr, Eu, Ge, or Cd, wherein $0 \le x \le 1$, and wherein $0 \le y \le 1$.

5. The PV detector of claim 1, wherein the non-Pb-salt layer comprises the n-type material, and wherein the Pb-salt layer comprises the p-type material.

6. The PV detector of claim 1, wherein the non-Pb-salt layer comprises the p-type material, and wherein the Pb-salt layer comprises the n-type material.

7. The PV detector of claim 1, wherein the non-Pb-salt layer is selected from a group consisting of $CdSe_{1-x}S_x$, $Cd_xZn_{1-x}Se_yS_{1-y}$, ZnO, and $TiO_2$, wherein $0 \le x \le 1$, and wherein $0 \le y \le 1$.

8. The PV detector of claim 1, wherein the non-Pb-salt layer comprises a material that forms a type II band alignment that is suitable for PV detector fabrication.

9. The PV detector of claim 1, further comprising a readout circuit directly disposed on the non-Pb-salt layer.

10. The PV detector of claim 1, wherein the IV-VI Pb-salt layer is selected from the group consisting of polycrystalline materials and mono-crystalline materials.

11. The PV detector of claim 1, wherein the IV-VI Pb-salt layer is disposed above the non-Pb-salt layer.

12. The PV detector of claim 1, wherein the IV-VI Pb-salt layer is disposed below the non-Pb-salt layer.

13. The PV detector of claim 1, wherein the non-Pb-salt layer is selected from a group consisting of a group IIB-VI material and an oxide material.

14. A focal plane array comprising one or more of the PV detectors of claim 1 disposed upon an array substrate.

15. A detector for detecting infrared light comprising:
a substrate;
a IV-VI Lead (Pb)-salt layer disposed on the substrate;
a plurality of junction layers applied to an upper surface of the IV-VI Pb-salt layer to form a plurality of junctions comprising either p-n junctions or Schottky contact junctions;
one or more junction electrical contacts that are interconnected with each other and applied to an upper surface of the plurality of junction layers; and
one or more Pb-salt electrical contacts that are interconnected with each other and coupled to a portion of the IV-VI Pb-salt layer,
wherein the junctions are configured to illuminate and generate a photoelectric current,
wherein the IV-VI Pb-salt layer is configured to absorb the photoelectric current, and wherein
the one or more junction electrical contacts and the one or more Pb-salt electrical contacts are configured to collect a plurality of free electrons and a plurality of free holes.

16. The detector of claim 15, wherein the plurality of junctions are p-n junctions configured with a type II band alignment such that a first conduction band of an n-type material of the p-n junctions is about equal to or at a lower energy level than a second conduction band of a p-type material of the p-n junctions.

17. The detector of claim 15, wherein the IV-VI Pb-salt layer is a polycrystalline material in a microcrystalline form or a nano-structure form.

18. The detector of claim 15, wherein the IV-VI Pb-salt layer comprises a compound selected from a group consisting of $Pb_xX_{1-x}Se_yTe_{1-y}$, $Pb_xX_{1-x}Se_yS_{1-y}$, and $Pb_xX_{1-x}Te_yS_{1-y}$, wherein X is Sn, Sr, Eu, Ge, or Cd, wherein $0 \leq x \leq 1$, and wherein $0 \leq y \leq 1$.

19. The detector of claim 15, wherein the one or more Pb-salt electrical contacts are positioned between the junction layers.

20. The detector of claim 15, wherein the plurality of junction layers comprises a non-Pb-salt layer that forms a plurality of heterojunctions or the Schottky contact junctions.

21. The detector of claim 15, wherein the non-Pb-salt layer is selected from a group consisting of $CdSe_{1-x}S_x$, $Cd_xZn_{1-x}Se_yS_{1-y}$, ZnO, and $TiO_2$, wherein $0 \leq x \leq 1$, and wherein $0 \leq y \leq 1$.

* * * * *